(12) United States Patent
Kim

(10) Patent No.: US 12,368,099 B2
(45) Date of Patent: Jul. 22, 2025

(54) SEMICONDUCTOR DEVICE AND ELECTRONIC SYSTEM INCLUDING THE SAME

(71) Applicant: SAMSUNG ELECTRONICS CO., LTD., Suwon-si (KR)

(72) Inventor: Junhyoung Kim, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 824 days.

(21) Appl. No.: 17/509,713

(22) Filed: Oct. 25, 2021

(65) Prior Publication Data

US 2022/0173028 A1 Jun. 2, 2022

(30) Foreign Application Priority Data

Dec. 2, 2020 (KR) .................. 10-2020-0166968

(51) Int. Cl.
| | |
|---|---|
| H10B 41/27 | (2023.01) |
| H01L 23/522 | (2006.01) |
| H01L 23/528 | (2006.01) |
| H10B 41/41 | (2023.01) |
| H10B 43/27 | (2023.01) |
| H10B 43/40 | (2023.01) |

(52) U.S. Cl.
CPC ........ H01L 23/528 (2013.01); H01L 23/5226 (2013.01); H10B 41/27 (2023.02); H10B 41/41 (2023.02); H10B 43/27 (2023.02); H10B 43/40 (2023.02)

(58) Field of Classification Search
CPC ........ H10B 41/41; H10B 43/27; H10B 41/27; H10B 43/40; H10B 41/50; H10B 43/10; H10B 41/10; H10B 43/30; H10B 43/50; H10B 41/35; H10B 43/35; H01L 23/5226; H01L 23/528; H01L 21/76877; H01L 29/4234; H01L 29/42324; H01L 29/788; H01L 29/792
See application file for complete search history.

(56) References Cited

U.S. PATENT DOCUMENTS

| | | |
|---|---|---|
| 6,410,948 B1 | 6/2002 | Tran et al. |
| 7,223,678 B2 | 5/2007 | Noble et al. |
| 7,759,704 B2 | 7/2010 | Popp et al. |
| 9,257,572 B2 | 2/2016 | Seol et al. |

(Continued)

*Primary Examiner* — Moazzam Hossain
(74) *Attorney, Agent, or Firm* — Morgan, Lewis & Bockius LLP

(57) ABSTRACT

A semiconductor device includes a plurality of gate electrodes on a substrate to be spaced apart from each other in a vertical direction; a plurality of channel structures penetrating through the gate electrodes and extending in the vertical direction; a string separation insulation layer penetrating through two topmost gate electrodes and extending in a first horizontal direction; a plurality of bit line contacts on the plurality of channel structures; and a plurality of bit lines on the plurality of bit line contacts. Each of the bit lines includes a first segment extending in a second horizontal direction; a second segment spaced apart from the first segment in the first horizontal direction and extending in the second horizontal direction; and a first bending portion connecting the first segment to the second segment and extending at inclination angle of about 20 to 70 degrees with respect to the second horizontal direction.

20 Claims, 20 Drawing Sheets

(56) References Cited

U.S. PATENT DOCUMENTS

| | | |
|---|---|---|
| 10,153,027 B1 | 12/2018 | Tang et al. |
| 2003/0102515 A1* | 6/2003 | Tran ..................... H10B 12/033 257/390 |
| 2016/0293627 A1* | 10/2016 | Kim ....................... H10B 43/10 |
| 2018/0130818 A1 | 5/2018 | Kim et al. |
| 2019/0043881 A1* | 2/2019 | Kim .................. H10D 30/6735 |
| 2020/0350326 A1* | 11/2020 | Yun ....................... H10B 41/27 |

* cited by examiner

SEMICONDUCTOR DEVICE AND ELECTRONIC SYSTEM INCLUDING THE SAME

CROSS-REFERENCE TO RELATED APPLICATION

This application is based on and claims priority under 35 U.S.C. § 119 to Korean Patent Application No. 10-2020-0166968, filed on Dec. 2, 2020, in the Korean Intellectual Property Office, the disclosure of which is incorporated by reference herein in its entirety.

BACKGROUND

The disclosure relates to semiconductor devices and electronic systems including the same, and more particularly, to a semiconductor device including a vertical channel, and an electronic system including the semiconductor device.

Electronic systems requiring data storage need a semiconductor device capable of storing high-capacity data. Accordingly, research is being carried out on a solution for increasing the data storage capacity of a semiconductor device. For example, a semiconductor device including three-dimensionally arranged memory cells instead of two-dimensionally arranged memory cells has been proposed as a method of increasing the data storage capacity of a semiconductor device.

SUMMARY

The disclosure provides a semiconductor device having improved electrical performance by including channel structures arranged with a narrow pitch and bit lines connected to the channel structures to have a low electrical resistance.

The disclosure provides an electronic system including the semiconductor device.

According to an aspect of the disclosure, there is provided a semiconductor device including a plurality of gate electrodes arranged on a substrate so as to be spaced apart from each other in a vertical direction perpendicular to an upper surface of the substrate; a plurality of channel structures each penetrating through the plurality of gate electrodes and extending in the vertical direction; a string separation insulation layer penetrating through two topmost gate electrodes and extending in a first horizontal direction parallel to the upper surface of the substrate; a plurality of bit line contacts arranged on the plurality of channel structures; and a plurality of bit lines arranged on the plurality of bit line contacts, each of the bit lines including a first segment extending in a second horizontal direction perpendicular to the first horizontal direction; a second segment spaced apart from the first segment in the first horizontal direction and extending in the second horizontal direction; and a first bending portion connecting the first segment to the second segment and extending at an inclination angle of about 20 degrees to about 70 degrees with respect to the second horizontal direction.

According to another aspect of the disclosure, there is provided a semiconductor device including a plurality of gate electrodes arranged on a substrate so as to be spaced apart from each other in a vertical direction perpendicular to an upper surface of the substrate; a plurality of channel structures each penetrating through the plurality of gate electrodes and extending in the vertical direction; a string separation insulation layer penetrating through two topmost gate electrodes and extending in a first horizontal direction; and a plurality of bit lines arranged on the plurality of channel structures, each of the bit lines including a first segment extending in a second horizontal direction perpendicular to the first horizontal direction, a second segment spaced apart from the first segment in the first horizontal direction and extending in the second horizontal direction, and a first bending portion connecting the first segment to the second segment.

According to another aspect of the disclosure, there is provided an electronic system including a main substrate; a semiconductor device on the main substrate; and a controller arranged on the main substrate and electrically connected to the semiconductor device. The semiconductor device includes a plurality of gate electrodes arranged on a substrate so as to be spaced apart from each other in a vertical direction perpendicular to an upper surface of the substrate; a plurality of channel structures each penetrating through the plurality of gate electrodes and extending in the vertical direction; a string separation insulation layer penetrating through two topmost gate electrodes and extending in a first horizontal direction; a plurality of bit lines arranged on the plurality of channel structures, each of the bit lines including a first segment extending in a second horizontal direction perpendicular to the first horizontal direction, a second segment spaced apart from the first segment in the first horizontal direction and extending in the second horizontal direction, and a first bending portion connecting the first segment to the second segment; a peripheral circuit electrically connected to the plurality of gate electrodes and the plurality of bit lines; and an input/output (I/O) pad electrically connected to the peripheral circuit.

BRIEF DESCRIPTION OF THE DRAWINGS

Exemplary embodiments of the disclosure will be more clearly understood from the following detailed description taken in conjunction with the accompanying drawings in which.

DETAILED DESCRIPTION OF THE EMBODIMENTS

Embodiments will now be described fully with reference to the accompanying drawings.

Figure 1:
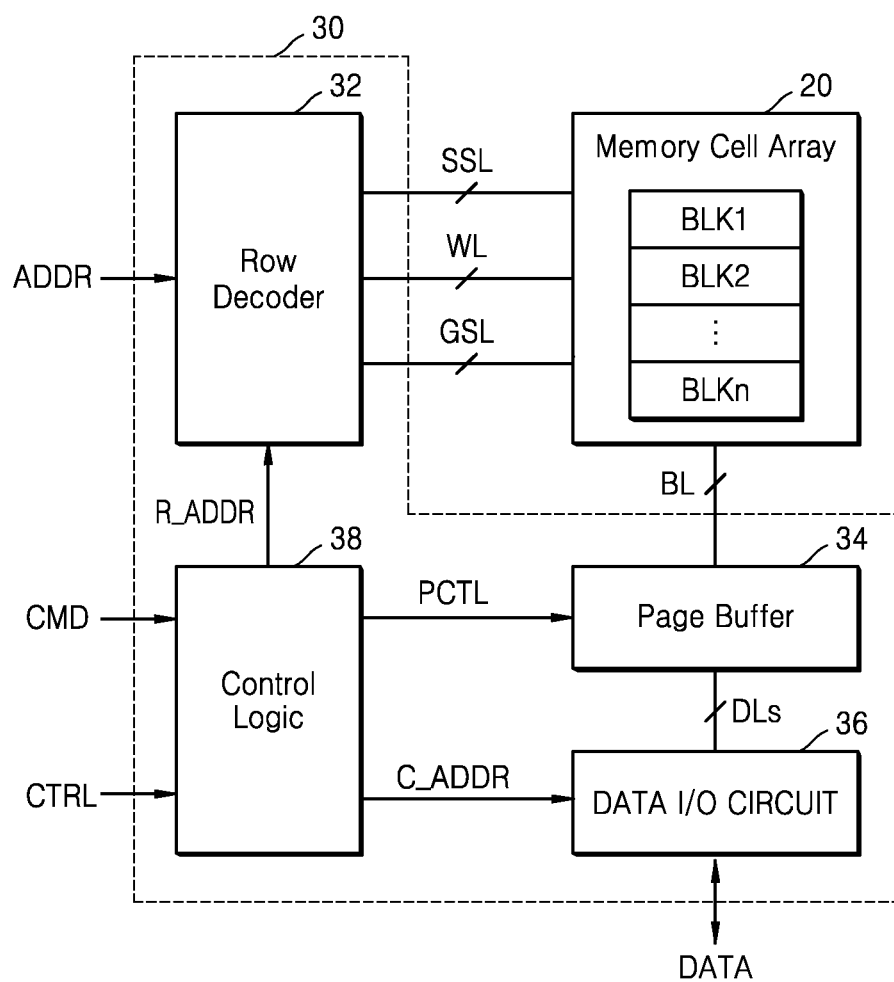
FIG. 1 is a block diagram of a semiconductor device according to embodiments.

FIG. 1 is a block diagram of a semiconductor device 10 according to embodiments.

Referring to FIG. 1, the semiconductor device 10 may include a memory cell array 20 and a peripheral circuit 30. The memory cell array 20 includes a plurality of memory cell blocks BLK1, BLK2, through BLKn. Each of the plurality of memory cell blocks BLK1, BLK2, through BLKn may include a plurality of memory cells. The plurality of memory cell blocks BLK1, BLK2, through BLKn may be connected to the peripheral circuit 30 via bit lines BL, word lines WL, cell string select lines SSL, and ground select lines GSL.

The peripheral circuit 30 may include a row decoder 32, a page buffer 34, a data input/output (I/O) circuit 36, and a control logic 38. Although not shown in FIG. 1, the peripheral circuit 30 may further include an input/output interface, a column logic, a voltage generator, a pre-decoder, a temperature sensor, a command decoder, an address decoder, an amplification circuit, and the like.

The memory cell array 20 may be connected to the page buffer 34 via the bit lines BL, and may be connected to the row decoder 32 via the word lines WL, the string selection lines SSL, and the ground selection lines GSL. In the memory cell array 20, the plurality of memory cells included in the plurality of memory cell blocks BLK1, BLK2, through BLKn may be flash memory cells. The memory cell array 20 may include a three-dimensional memory cell array. The three-dimensional memory cell array may include a plurality of NAND strings, each of which may include a plurality of memory cells connected to a plurality of word lines WL vertically stacked on a substrate.

The peripheral circuit 30 may receive an address ADDR, a command CMD, and a control signal CTRL from the outside of the semiconductor device 10, and may transmit or receive data DATA to or from a device outside the semiconductor device 10.

In response to the address ADDR, the row decoder 32 may select at least one memory cell block from the plurality of memory cell blocks BLK1, BLK2, through BLKn and select a word line WL, a string select line SSL, and a ground select line GSL of the selected memory cell block. The row decoder 32 may transmit a voltage for performing a memory operation to the word line of the selected memory cell block.

The page buffer 34 may be connected to the memory cell array 20 via the bit lines BL. The page buffer 34 may operate as a write driver during a program operation to apply a voltage according to the data DATA desired to be stored in the memory cell array 20 to the bit lines BL and may operate as a sense amplifier during a read operation to sense the data DATA stored in the memory cell array 20. The page buffer 34 may operate according to a control signal PCTL received from the control logic 38.

The data I/O circuit 36 may be connected to the page buffer 34 via data lines DLs. The data I/O circuit 36 may receive the data DATA from a memory controller (not shown) during a program operation and may provide program data DATA to the page buffer 34, based on a column address C_ADDR received from the control logic 38. During a read operation, the data I/O circuit 36 may provide read data DATA stored in the page buffer 34 based on the column address C_ADDR received from the control logic 38 to the memory controller.

The data I/O circuit 36 may transmit an input address or instruction to the control logic 38 or the row decoder 32. The peripheral circuit 30 may further include an electrostatic discharge (ESD) circuit and a pull-up/pull-down driver.

The control logic 38 may receive the command CMD and the control signal CTRL from the memory controller. The control logic 38 may provide a row address R_ADDR to the row decoder 32 and may provide the column address C_ADDR to the data I/O circuit 36. The control logic 38 may generate various internal control signals that are used within the semiconductor device 10, in response to the control signal CTRL. For example, the control logic 38 may adjust the level of a voltage that is provided to the word lines WL and the bit lines BL during a memory operation, such as a program operation or an erase operation.

Figure 2:
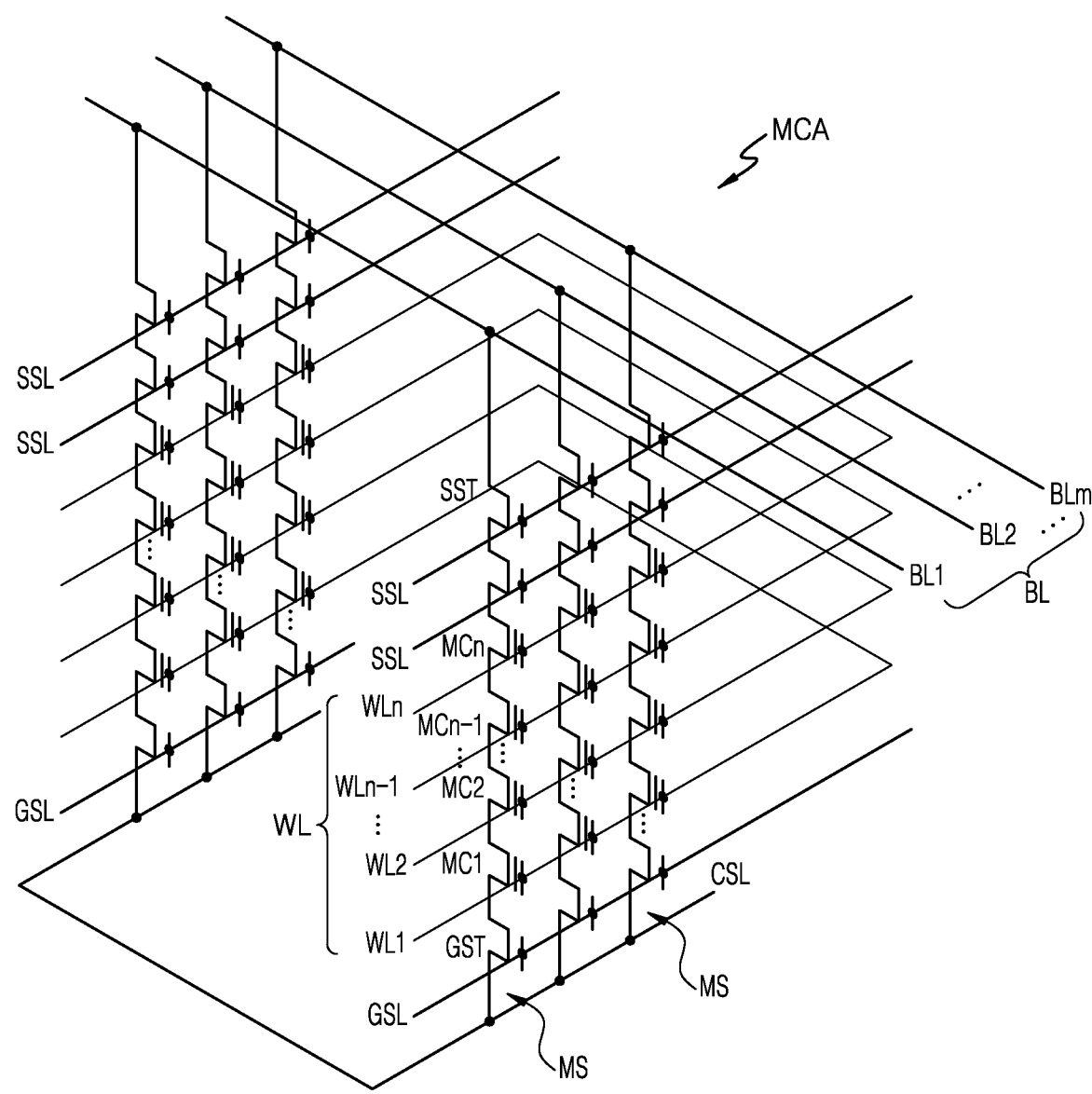
FIG. 2 is an equivalent circuit diagram of a memory cell array of a semiconductor device according to embodiments.

FIG. 2 is an equivalent circuit diagram of a memory cell array of the semiconductor device 10 according to embodiments.

Referring to FIG. 2, a memory cell array MCA may include a plurality of memory cell strings MS. The memory cell array MCA may include a plurality of bit lines BL (BL1, BL2, . . . , BLm), a plurality of word lines WL (WL1, WL2, . . . , WLn-1, WLn), at least one string selection line SSL, at least one ground selection line GSL, and a common source line CSL. The plurality of memory cell strings MS may be formed between the plurality of bit lines BL (BL1, BL2, . . . , BLm) and the common source line CSL. Although FIG. 2 illustrates a case where each of the plurality of memory cell strings MS includes two string selection lines SSL, the technical spirit of the disclosure is not limited thereto. For example, each of the plurality of memory cell strings MS may include one string selection line SSL.

Each of the plurality of memory cell strings MS may include a string selection transistor SST, a ground selection transistor GST, and a plurality of memory cell transistors MC1, MC2, . . . , MCn-1, MCn. Drain regions of the string selection transistors SST may be connected to the bit lines BL (BL1, BL2, . . . , BLm), and source regions of the ground selection transistors GST may be connected to the common source line CSL. The common source line CSL may be a region to which source regions of a plurality of ground selection transistors GST are commonly connected.

The string selection transistors SST may be connected to a string selection line SSL, and the ground selection transistors GST may be connected to a ground selection line GSL. The plurality of memory cell transistors MC1, MC2, . . . , MCn-1, MCn may be connected to the plurality of word lines WL (WL1, WL2, . . . , WLn-1, WLn), respectively.

Figure 3:
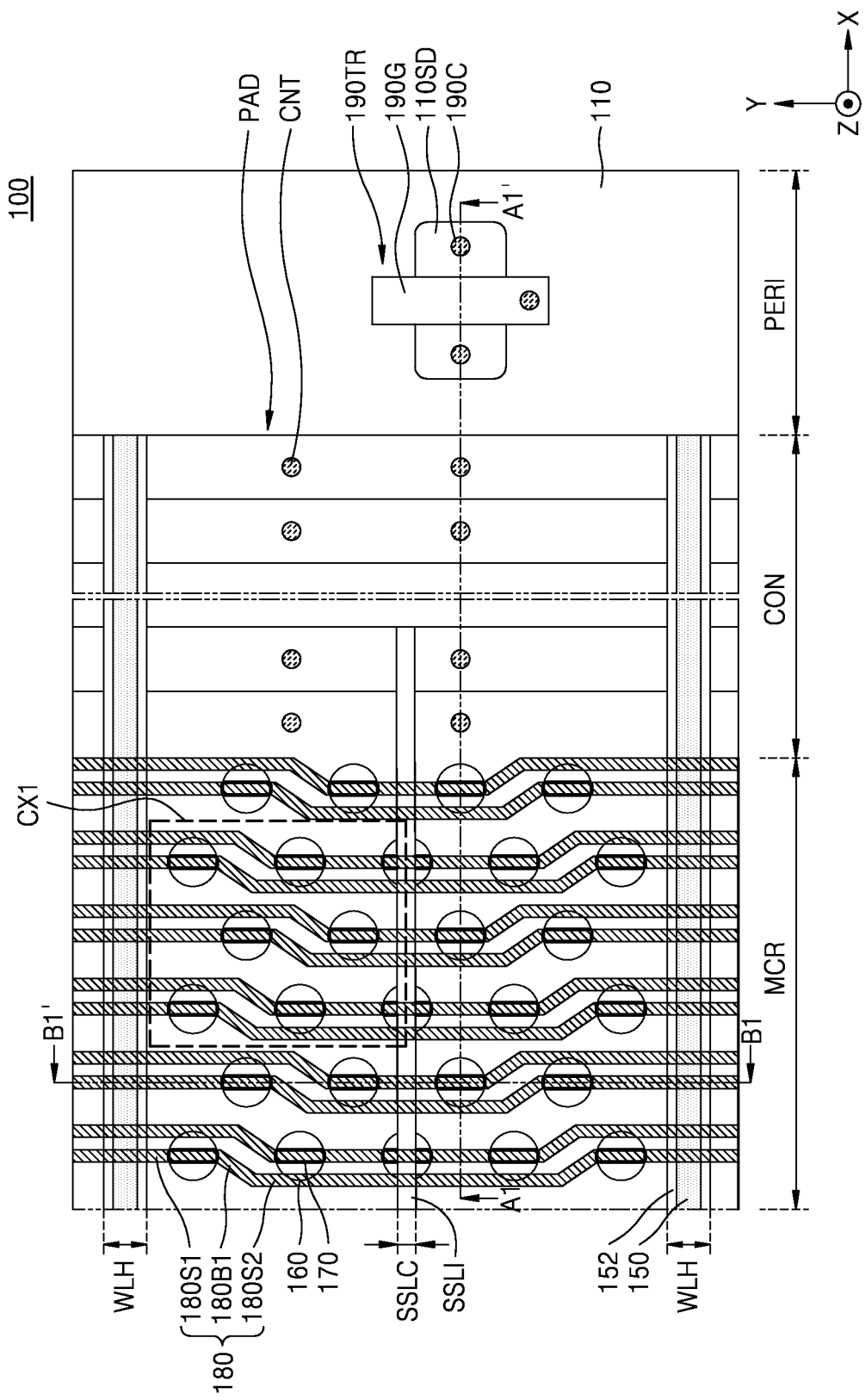
FIG. 3 is a plan view of a representative structure of a semiconductor device according to embodiments.
Figure 4:
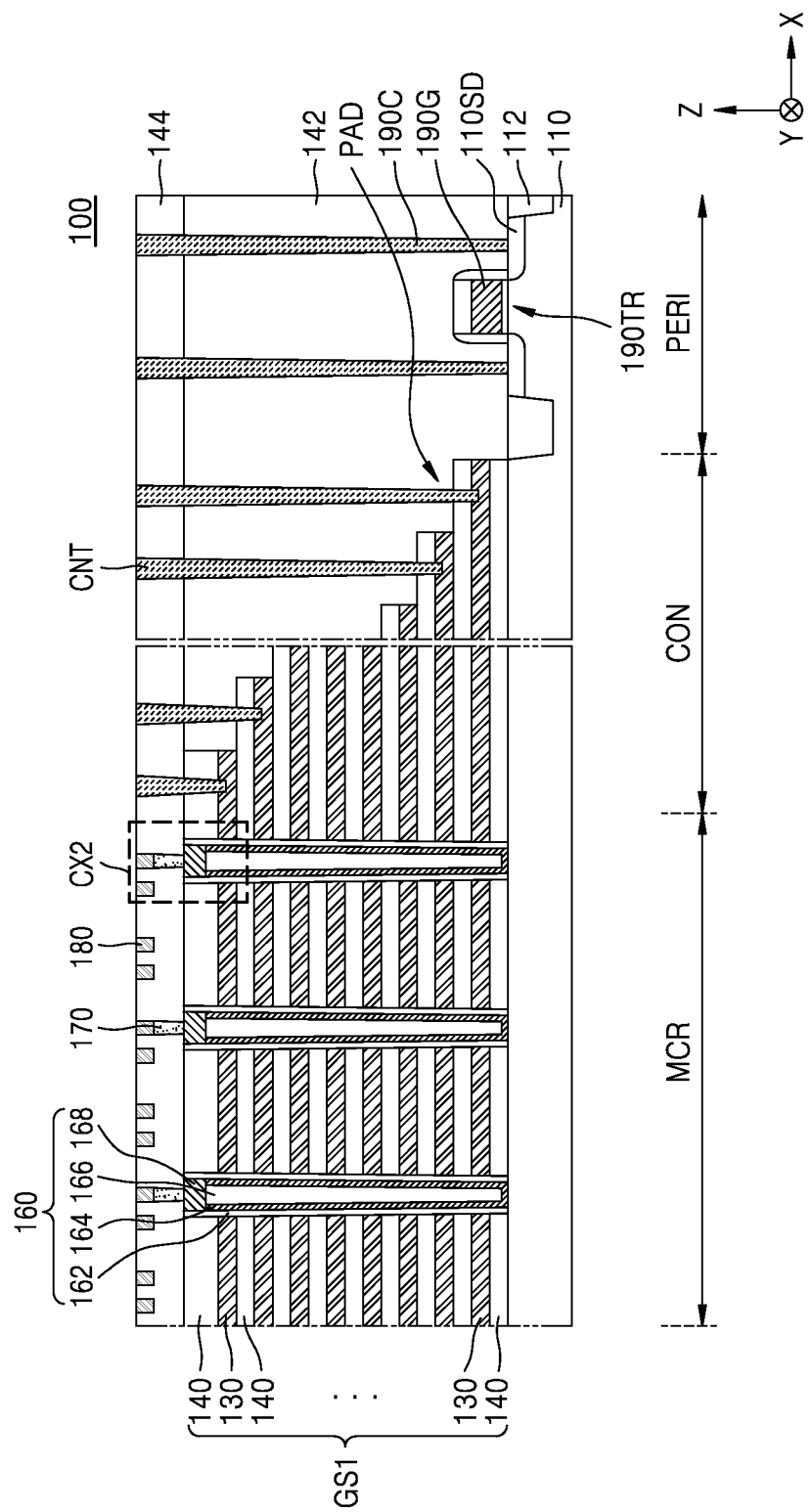
FIG. 4 is a cross-sectional view of the semiconductor device, taken along line A1-A1' in FIG. 3.
Figure 5:
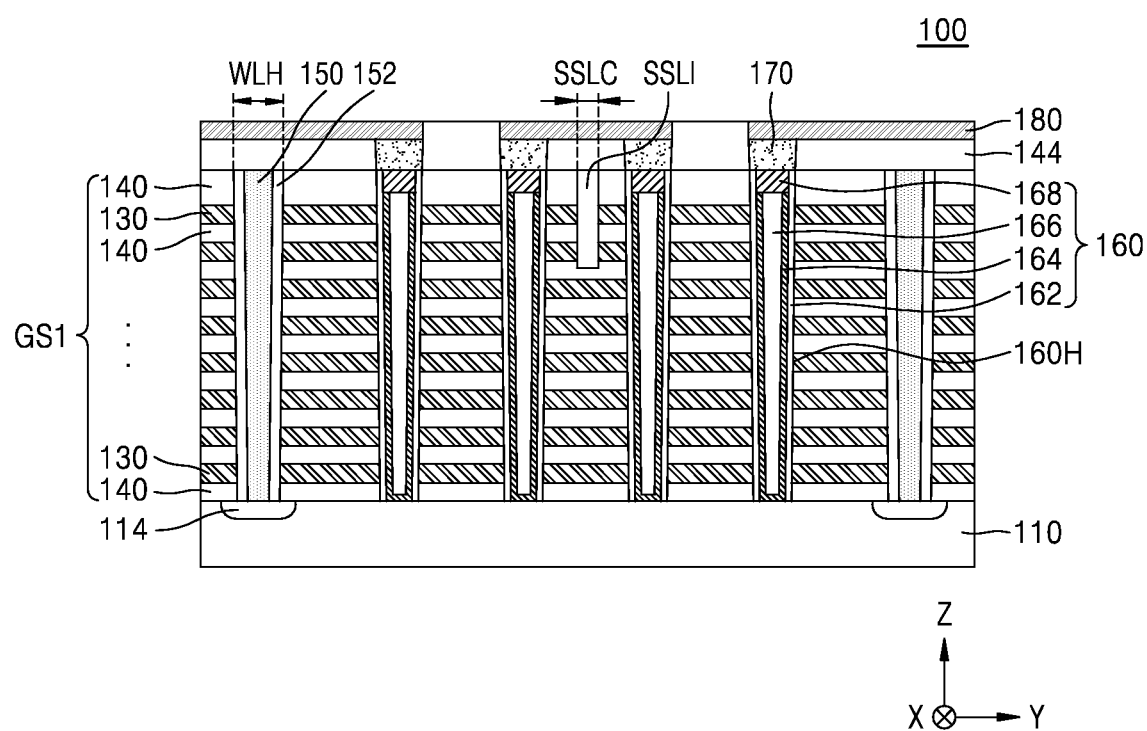
FIG. 5 is a cross-sectional view of the semiconductor device, taken along line B1-B1' in FIG. 3.
Figure 6:
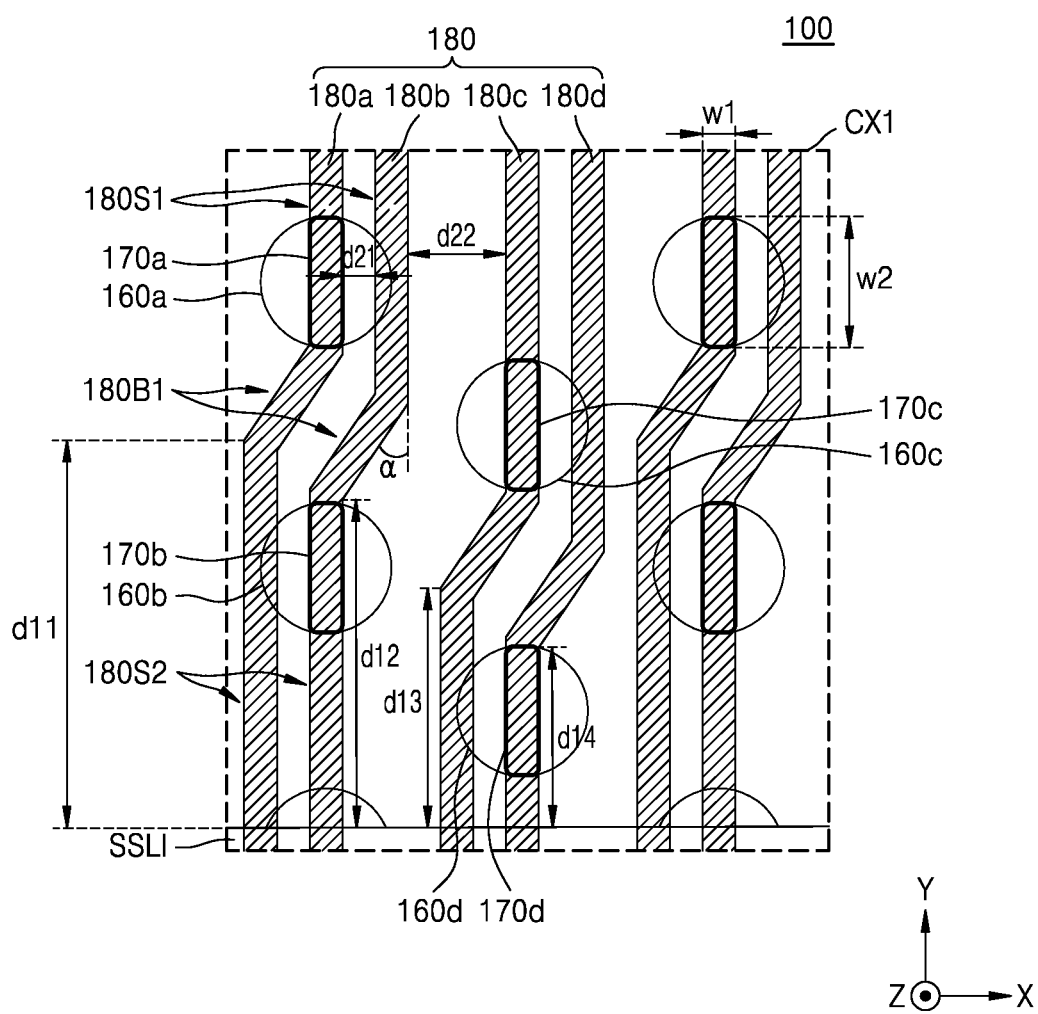
FIG. 6 is an enlarged view of a region CX1 of FIG. 3.
Figure 7:
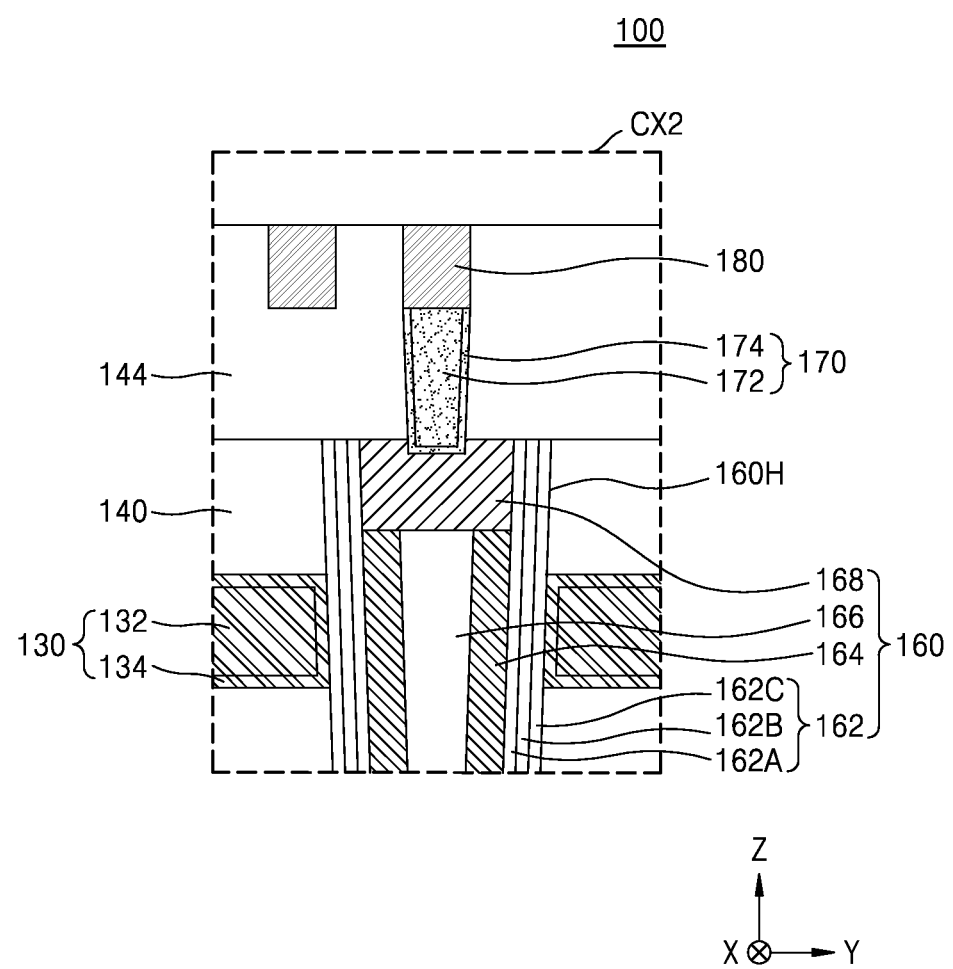
FIG. 7 is an enlarged sectional view of a region CX2 of FIG. 4.

FIGS. 3 through 7 are views for explaining a semiconductor device 100 according to embodiments. In detail, FIG. 3 is a plan view of a representative structure of the semiconductor device 100 according to embodiments. FIG. 4 is a cross-sectional view of the semiconductor device 100, taken along line A1-A1' in FIG. 3. FIG. 5 is a cross-sectional view of the semiconductor device 100, taken along line B1-B1' in FIG. 3. FIG. 6 is a magnified view of a region CX1 of FIG. 3, and FIG. 7 is a magnified cross-sectional view of a region CX2 of FIG. 4. For convenience of illustration and understanding, FIG. 3 schematically illustrates only some components of the semiconductor device 100.

Referring to FIGS. 3 through 7, the semiconductor device 100 may include a memory cell region MCR, a connection region CON, and a peripheral circuit region PERI horizontally arranged on a substrate 110. The memory cell region MCR may be a region where a vertical channel structure NAND type memory cell array MCA (see FIG. 2) driven according to the method described above with reference to FIG. 2 is formed. The connection region CON may be a region where a pad portion PAD for electrical connection between the peripheral circuit region PERI and the memory cell array MCA formed in the memory cell region MCR.

In the peripheral circuit region PERI, a peripheral circuit transistor 190TR and a peripheral circuit contact 190C may be arranged on the substrate 110. In the substrate 110, an active region AC may be defined by an isolation layer 112, and a plurality of peripheral circuit transistors 190TR may be formed on the active region AC. Each of the plurality of peripheral circuit transistors 190TR may include a peripheral circuit gate 190G and a source/drain region 110SD arranged in a portion of the substrate 110 on both sides of the peripheral circuit gate 190G. The plurality of peripheral circuit contacts 190C may be arranged on the peripheral circuit gate 190G and the source/drain region 110SD.

The substrate 110 may include a semiconductor material, for example, a Group IV semiconductor, a Group III-V compound semiconductor, or a Group II-VI oxide semiconductor. For example, the Group IV semiconductor may include silicon (Si), germanium (Ge), or Si—Ge. The substrate 110 may be a bulky wafer or an epitaxial layer. According to another embodiment, the substrate 110 may include a silicon-on-insulator (SOI) substrate or a germanium-on-insulator (GeOI) substrate.

A first gate stack GS1 may extend in a first horizontal direction X and a second horizontal direction Y parallel to an upper surface of the substrate 110, on the substrate 110. The first gate stack GS1 may include a plurality of first gate electrodes 130 and a plurality of first insulation layers 140, and the plurality of first gate electrodes 130 and the plurality of first insulation layers 140 may alternate with each other in a vertical direction Z perpendicular to the upper surface of the substrate 110.

As shown in FIG. 7, a first gate electrode 130 may include a buried conductive layer 132 and a conductive barrier layer 134 surrounding an upper surface, a lower surface, and a lateral surface of the buried conductive layer 132. For example, the buried conductive layer 132 may include a metal (such as, tungsten, nickel, cobalt, or tantalum), metal silicide (such as, tungsten silicide, nickel silicide, cobalt silicide, or tantalum silicide), doped silicon, or combination thereof. According to some embodiments, the conductive barrier layer 134 may include titanium nitride, tantalum nitride, tungsten nitride, or a combination thereof. According to embodiments, a dielectric liner (not shown) may be interposed between the conductive barrier layer 134 and a first insulation layer 140 and may include a high-k dielectric material such as aluminum oxide.

According to embodiments, the plurality of first gate electrodes 130 may correspond to the ground selection line GSL, the word lines WL (WL1, WL2, . . . , WLn-1, WLn), and the at least one string selection line SSL that constitute the memory cell string MS of FIG. 2. For example, a lowest first gate electrode 130 may function as a ground selection line GSL, two topmost first gate electrodes 130 may function as string selection lines SSL, and the remaining first gate electrodes 130 may function as the word lines WL. Accordingly, a memory cell string MS in which a ground selection transistor GST, a selection transistor SST, and memory cell transistors MC1, MC2, . . . , MCn-1, MCn therebetween are serially connected to one another may be provided. According to some embodiments, at least one of the first gate electrodes 130 may function as a dummy word line. However, embodiments of the disclosure are not limited thereto.

As shown in FIG. 3, a plurality of gate stack separation openings WLH may extend in a first horizontal direction X parallel to the upper surface of the substrate 110, on the substrate 110. A first gate stack GS1 arranged between a pair of gate stack separation openings WLH may constitute one block, and the pair of gate stack separation openings WLH may define a width of the first gate stack GS1 in a second horizontal direction Y.

A common source line 150, filling the inside of gate stack separation openings WLH, and gate stack separation insulation layers 152 arranged on both lateral walls of the common source line 150 may be arranged on the substrate 110. A common source region 114 may be further formed in a portion of the substrate 110 vertically overlapped by the gate stack separation opening WLH, and the common source line 150 may be arranged to be electrically connected to the common source region 114. The common source region 114 may be an impurity region in which n-type impurities are doped at a high concentration and may function as a source region that provides a current to memory cells.

Each of the gate stack separation insulation layers 152 may include silicon oxide, silicon nitride, silicon oxynitride, or a low dielectric material. For example, each of the gate stack separation insulation layers 152 may include a silicon oxide layer, a silicon nitride layer, SiON, SiOCN, SiCN, or a combination thereof.

The plurality of channel structures 160 may each extend from the upper surface of the substrate 110 in a vertical direction (Z direction) by penetrating through the first gate stack GS1, in the memory cell region MCR. The plurality of channel structures 160 may be arranged apart from each other by a predetermined interval in the first horizontal direction X, the second horizontal direction Y, and a third horizontal direction (for example, a diagonal direction). The plurality of channel structures 160 may be arranged in a zigzag shape or staggered shape.

Each of the plurality of channel structures 160 may be arranged within a channel hole 160H. Each of the plurality of channel structures 160 may include a gate insulation layer 162, a channel layer 164, a buried insulation layer 166, and a conductive plug 168. The gate insulation layer 162 and the channel layer 164 may be sequentially arranged on a lateral wall of the channel hole 160H. For example, the gate insulation layer 162 may be conformally arranged on the lateral wall of the channel hole 160H, and the channel layer 164 may be conformally arranged on the lateral wall and a bottom portion of the channel hole 160H. The buried insulation layer 166 filling a residual space of the channel hole 160H may be arranged on the channel layer 164. The conductive plug 168 contacting the channel layer 164 and blocking an entrance of the channel hole 160H may be arranged on the upper side of the channel hole 160H. According to other embodiments, the buried insulation layer 166 may be omitted and the channel layer 164 may be formed in a pillar shape that fills a residual portion of the channel hole 160H.

According to embodiments, the channel layer 164 may be arranged to contact the upper surface of the substrate 110 at a bottom portion of the channel hole 160H. Alternatively, a contact semiconductor layer (not shown) having a predetermined height may be further formed on the substrate 110 at the bottom portion of the channel hole 160H and the channel layer 164 may be electrically connected to the substrate 110 through the contact semiconductor layer. For example, the contact semiconductor layer may include a silicon layer formed by selective epitaxy growth (SEG) by using the substrate 110 arranged on the bottom portion of the channel hole 160H as a seed layer. According to some embodiments, in contrast with the illustration of FIG. 4, a bottom surface of the channel layer 164 may be arranged on a vertical level that is lower than the upper surface of the substrate 110.

As shown in FIG. 7, the gate insulation layer 162 may have a structure sequentially including a tunneling dielectric layer 162A, a charge storage layer 162B, and a blocking dielectric layer 162C on an outer sidewall of the channel layer 164. Relative thicknesses of the tunneling dielectric layer 162A, the charge storage layer 162B, and the blocking dielectric layer 162C that constitute the gate insulation layer 162 are not limited to the illustration of FIG. 7, and may be variously modified.

The tunneling dielectric layer 162A may include silicon oxide, hafnium silicide, aluminum oxide, zirconium oxide, tantalum oxide, or the like. The charge storage layer 162B may be a region where electrons from the channel layer 164 having passed the tunneling dielectric layer 162A may be stored and may include silicon nitride, boron nitride, silicon boron nitride, or impurity-doped polysilicon. The blocking dielectric layer 162C may include silicon oxide, silicon nitride, or metal oxide having larger permittivity than silicon oxide. The metal oxide may be hafnium oxide, aluminum oxide, zirconium oxide, tantalum oxide, or a combination thereof.

Within one block, two topmost first gate electrodes 130 may be each separated into two portions by a string selection line cut region SSLC in a plan view. A string separation insulation layer SSLI may be arranged within the string selection line cut region SSLC and the two portions may be spaced apart from each other in the second horizontal direction Y with the string separation insulation layer SSLI interposed between the two portions. The two portions may constitute the string selection line SSL described above with reference to FIG. 2.

In the connection region CON, the first gate stack GS1 may extend to constitute the pad portion PAD. In the connection region CON, the plurality of first gate electrodes 130 may each extend to have a shorter length in the first horizontal direction X, away from the upper surface of the substrate 110. The pad portion PAD may be referred to as portions of the first gate electrodes 130 arranged to form a stair shape. A cover insulation layer 142 may be arranged on a portion of the first gate stack GS1 that forms the pad portion PAD. In the connection region CON, cell contact plugs CNT connected to the first gate electrode 130 by penetrating through the cover insulation layer 142 may be arranged.

Although not shown, a plurality of dummy channel structures (not shown) each extending from the upper surface of the substrate 110 in the vertical direction Z by penetrating through the first gate stack GS1 may be further formed in the connection region CON. The dummy channel structures may be formed to prevent leaning or bending of the first gate stack GS1 during the manufacture of the semiconductor device 100 and to secure structural stability of the first gate stack GS1. Each of the plurality of dummy channel structures may have a similar structure and similar shape to the plurality of channel structures 160. An upper insulation layer 144 may be disposed between the first gate stack GS1 and the cover insulation layer 142.

Bit line contacts 170 may contact the conductive plugs 168 of the channel structures 160 by penetrating through the upper insulation layer 144, and bit lines 180 may be arranged on the bit line contacts 170. According to embodiments, sidewalls of the bit lines 180 may be surrounded by the upper insulation layer 144. However, alternatively, the bit lines 180 may be arranged on an upper surface of the upper insulation layer 144, and an additional insulation layer (not shown) may be further arranged on the upper insulation layer 144 in order to surround the sidewalls of the bit lines 180.

According to embodiments, as shown in FIG. 6, each bit line 180 may include a first segment 180S1 extending in the second horizontal direction Y, a second segment 180S2 spaced apart from the first segment 180S1 in the first horizontal direction X and extending in the second horizontal direction Y, and a first bending portion 180B1 connecting the first segment 180S1 to the second segment 180S2.

In a plan view, the first bending portion 180B1 may be inclined at an inclination angle α of about 20 degrees to about 70 degrees with respect to the second horizontal direction Y and may extend to a predetermined length. According to some embodiments, the first bending portion 180B1 may be inclined at an inclination angle α of about 30 degrees to about 50 degrees with respect to the second horizontal direction Y. However, embodiments of the disclosure are not limited thereto. The inclination angle α of the first bending portion 180B1 with respect to the second horizontal direction Y may vary according to the sizes and layout of the channel structures 160.

According to embodiments, as shown in FIG. 6, the bit lines 180 may include first, second, third, and fourth bit lines 180a, 180b, 180c, and 180d sequentially arranged in the first horizontal direction X. The respective first bending portions 180B1 of the first through fourth bit lines 180a, 180b, 180c, 180d may have different locations in the second horizontal direction Y, and a set of the first through fourth bit lines 180a, 180b, 180c, and 180d may be repeated in the first horizontal direction X.

According to embodiments, the first segment 180S1 of the first bit line 180a may be substantially parallel to the first segment 180S1 of the second bit line 180b, and the first bending portion 180B1 of the first bit line 180a may be substantially parallel to the first bending portion 180B1 of the second bit line 180b. The first segment 180S1 of the first bit line 180a may be aligned with the second segment 180S2 of the second bit line 180b in a straight line.

For example, the first bending portion 180B1 of the first bit line 180a may be spaced apart from the string separation insulation layer SSLI by a first distance d11, the first bending portion 180B1 of the second bit line 180b may be spaced apart from the string separation insulation layer SSLI by a second distance d12, and the second distance d12 may be less than the first distance d11. The first bending portion 180B1 of the third bit line 180c may be spaced apart from the string separation insulation layer SSLI by a third distance d13, and the third distance d13 may be less than the second distance d12. The first bending portion 180B1 of the fourth bit line 180d may be spaced apart from the string separation insulation layer SSLI by a fourth distance d14, and the fourth distance d14 may be less than the third distance d13.

As shown in FIG. 6, the channel structures 160 may include first, second, third, and fourth channel structures 160a, 160b, 160c, and 160d, and the first through fourth channel structures 160a, 160b, 160c, and 160d may have different locations in the second horizontal direction Y. For example, the first through fourth channel structures 160a, 160b, 160c, and 160d may be spaced apart from the string separation insulation layer SSLI by different distances, respectively, in the second horizontal direction Y.

The first channel structure 160a may be arranged farthest from the string separation insulation layer SSLI, and the second channel structure 160b may be arranged apart from the first channel structure 160a in the second horizontal direction Y. The third channel structure 160c may be arranged apart from the first channel structure 160a in the first horizontal direction X and the second horizontal direction Y, and the fourth channel structure 160d may be arranged apart from the third channel structure 160c in the second horizontal direction Y.

The first segment 180S1 of the first bit line 180a may be arranged over the first channel structure 160a, the second segment 180S2 of the second bit line 180b may be arranged over the second channel structure 160b, the first segment 180S1 of the third bit line 180c may be arranged over the third channel structure 160c, and the second segment 180S2 of the fourth bit line 180d may be arranged over the fourth channel structure 160d.

As shown in FIG. 6, in a plan view, the first bending portion 180B1 of the first bit line 180a and the first bending portion 180B1 of the second bit line 180b may be arranged between the first channel structure 160a and the second channel structure 160b. The first bending portion 180B1 of the third bit line 180c and the first bending portion 180B1 of the fourth bit line 180d may be arranged between the third channel structure 160c and the fourth channel structure 160d. For example, as shown in FIG. 6, each bit line contact 170 may not be vertically overlapped by the first bending portion 180B1 of each bit line 180. However, embodiments of the disclosure are not limited thereto.

According to embodiments, a first distance d21 between the first bit line 180a and the second bit line 180b in the first horizontal direction X may be in a range of about 10 nm to about 200 nm and a second distance d22 between the second bit line 180b and the third bit line 180c in the first horizontal direction X may be in a range of about 10 nm to about 200 nm. According to some embodiments, as shown in FIG. 6, the second distance d22 between the second bit line 180b and the third bit line 180c in the first horizontal direction X may be greater than the first distance d21 between the first bit line 180a and the second bit line 180b in the first horizontal direction X. According to other embodiments, the first distance d21 between the first bit line 180a and the second bit line 180b in the first horizontal direction X may be substantially equal to the second distance d22 between the second bit line 180b and the third bit line 180c in the first horizontal direction X.

According to embodiments, the first segment 180S1, the first bending portion 180B1, and the second segment 180S2 of the bit line 180 may be regions simultaneously patterned by a mask pattern formed by extreme ultraviolet (EUV) exposure. For example, the mask pattern may be formed using a photoresist material that is a photosensitive copolymer material of which chemical properties are changed by being exposed to EUV having a wavelength of 13.5 nm or a wavelength of less than 11 nm, and the bit line 180 may have a patterned shape including the first segment 180S1, the first bending portion 180B1, and the second segment 180S2 by using the mask pattern. In this case, even when the inclination angle α is relatively large and a gap between the bit line 180 and a bit line 180 adjacent thereto is relatively small, the bit line 180 may have a line shape having a relatively uniform width over the entire length thereof.

According to embodiments, the bit line contact 170 may include a contact conductive layer 172 and a conductive barrier layer 174 surrounding lateral surfaces and a bottom surface of the contact conductive layer 172. The bit line contact 170 may have a first width w1 in the first horizontal direction X, and a second width w2 greater than the first width w1 in the second horizontal direction Y. The first width w1 may be in a range of about 2 mm to about 50 nm and the second width w2 may be in a range of about 3 mm to about 100 nm, but the first width w1 and the second width w2 of the bit line contact 170 are not limited to the aforementioned ranges.

According to embodiments, the bit line contacts 170 may include first, second, third, and fourth bit line contacts 170a, 170b, 170c, and 170d and the first through fourth bit line contacts 170a, 170b, 170c, and 170d may be arranged on the first through fourth channel structures 160a, 160b, 160c, and 160d, respectively. The first through fourth bit line contacts 170a, 170b, 170c, and 170d may be arranged on respective center portions of the first through fourth channel structures 160a, 160b, 160c, and 160d in the first horizontal direction X, respectively. For example, in a plan view, a center line of the first channel structure 160a in the first horizontal direction X may be overlapped by the first bit line contact 170a and a center line of the second channel structure 160b in the first horizontal direction X may be overlapped by the second bit line contact 170b.

As the bit line contact 170 is arranged to overlap a center portion of the channel structure 160, a relatively large contact area between the bit line contact 170 and the channel structure 160 may be secured, and accordingly, the channel structure 160 and the bit line 180 may be arranged without forming an additional stud therebetween. For example, an upper surface of the bit line contact 170 may contact a lower surface of the bit line 180 and a lower surface of the bit line contact 170 may contact an upper surface of the channel structure 160.

In general, when two topmost first gate electrodes 130 are each divided into two ports by the string selection line cut region SSLC in a plan view within one block, two channel structures 160 (for example, the first channel structure 160a and the second channel structure 160b) arranged apart from each other in the second horizontal direction Y need to be connected to two bit lines 180 (for example, an odd-numbered bit line and an even-numbered bit line) adjacent to each other. As the sizes of the channel structures 160 and the pitches of the bit lines 180 decrease, a method of forming the bit lines 180 by using a double patterning technology (DPT) has been proposed. In this case, the shapes of the bit lines 180 are limited to a repetitive straight line shape having the same width or the same interval. Thus, an odd-numbered bit line is arranged at a location apart from the center of the first channel structure 160a to the left side, and an even-numbered bit line spaced apart from the odd-numbered bit line by a predetermined interval is arranged at a location apart from the center of the second channel structure 160b to the right side. In this case, in a plan view, the center line of the bit line 180 and the center line of the channel structure 160 may not be consistent with each other, and an additional stud needs to be arranged between the channel structure 160 and the bit line contact 170 in order to secure a sufficiently low contact resistance between the channel structure 160 and the bit line contact 170 (or a sufficiently large contact area between the channel structure 160 and the bit line contact 170).

However, according to the above-described embodiments, the bit lines 180 may be formed using a patterning process using EUV exposure, and, because the bit lines 180 include the first bending portions 180B1, the bit lines 180 may be arranged on the center portions of the channel structures 160 without forming an additional stud. The semiconductor device 100 may have a relatively low electrical resistance between the bit lines 180 and the channel structures 160, and thus, may have good electrical characteristics.

Figure 8:
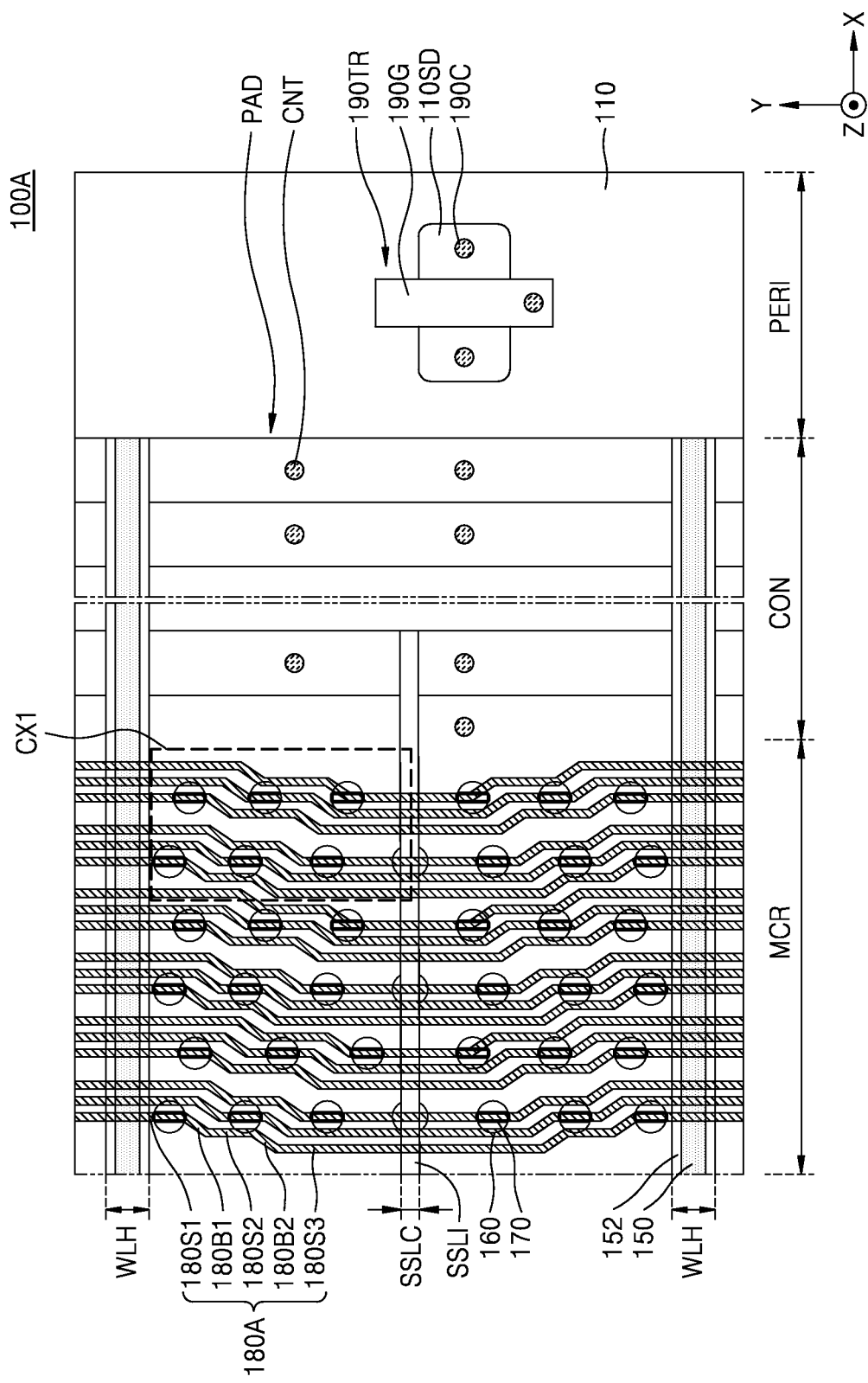
FIG. 8 is a plan view of a semiconductor device according to embodiments.
Figure 9:
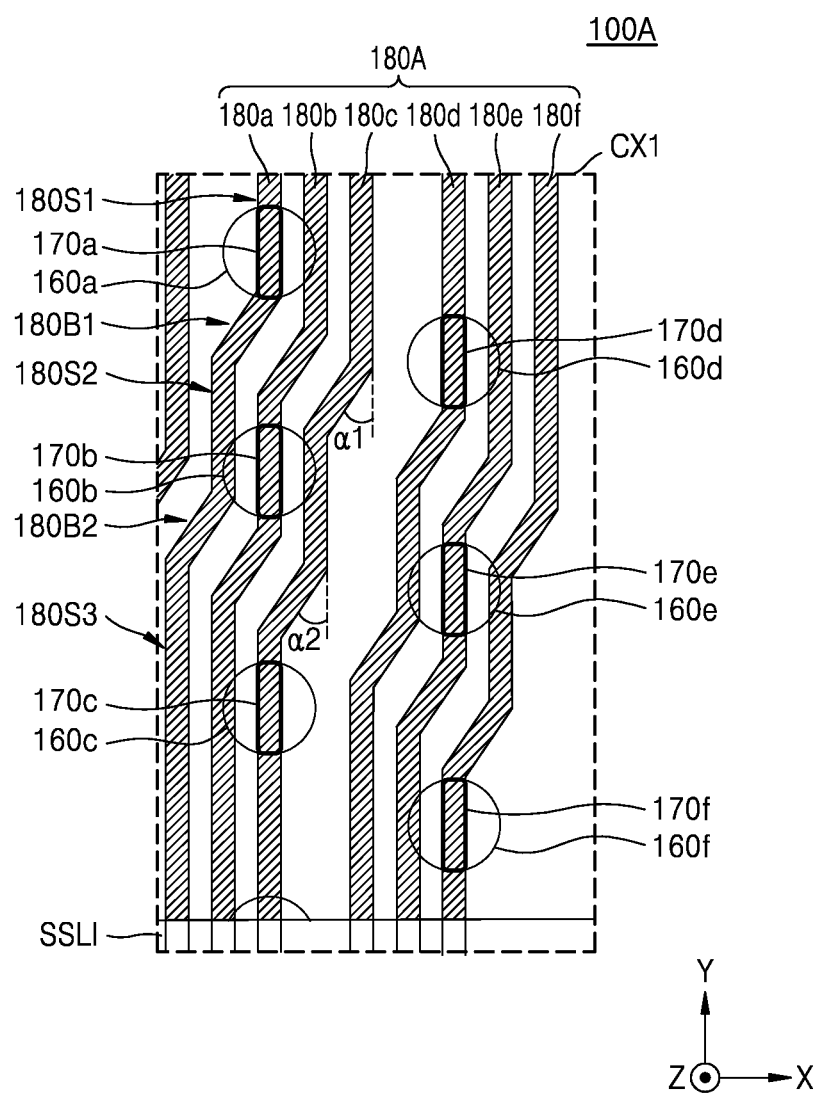
FIG. 9 is an enlarged view of a region CX1 of FIG. 8.

FIG. 8 is a plan view of a semiconductor device 100A according to embodiments. FIG. 9 is an enlarged view of a region CX1 of FIG. 8. The same reference numerals in FIGS. 1 through 7 and FIGS. 8 and 9 denote the same elements.

Referring to FIGS. 8 and 9, within one block, two topmost first gate electrodes 130 may be each separated into two portions by a string separation insulation layer SSLI in a 2D manner. One block includes an odd-numbered channel column including seven channel structures 160 arranged apart from each other in the second horizontal direction Y, and an even-numbered channel column including six channel structures 160 arranged apart from each other in the second horizontal direction Y.

Each bit line 180A may include a first segment 180S1 extending in the second horizontal direction Y, a second segment 180S2 spaced apart from the first segment 180S1 in the first horizontal direction X and extending in the second horizontal direction Y, a third segment 180S3 spaced apart from the second segment 180S2 in the first horizontal direction X and extending in the second horizontal direction Y, a first bending portion 180B1 connecting the first segment 180S1 to the second segment 180S2, and a second bending portion 180B2 connecting the second segment 180S2 to the third segment 180S3.

In a plan view, the first bending portion 180B1 may be inclined at an inclination angle α1 of about 20 degrees to about 70 degrees with respect to the second horizontal direction Y and may extend to a predetermined length and the second bending portion 180B2 may be inclined at an inclination angle α2 of about 20 degrees to about 70 degrees with respect to the second horizontal direction Y and may extend to a predetermined length. According to some embodiments, the first bending portion 180B1 and the second bending portion 180B2 may be inclined at inclination angles α1 and α2 of about 30 degrees to about 50 degrees with respect to the second horizontal direction Y. However, embodiments of the disclosure are not limited thereto. The inclination angles α1 and α2 of the first bending portion 180B1 and the second bending portion 180B2 with respect to the second horizontal direction Y may vary according to the sizes and layout of the channel structures 160.

As shown in FIG. 9, the bit lines 180A may include first, second, third, fourth, fifth, and sixth bit lines 180a, 180b, 180c, 180d, 180e, and 180f sequentially arranged in the first horizontal direction X. The respective first bending portions 180B1 of the first through sixth bit lines 180a, 180b, 180c, 180d, 180e, and 180f may have different locations in the second horizontal direction Y, and the respective second bending portions 180B2 of the first through sixth bit lines 180a, 180b, 180c, 180d, 180e, and 180f may have different locations in the second horizontal direction Y. A set of the first through sixth bit lines 180a, 180b, 180c, 180d, 180e, and 180f may be repeated in the first horizontal direction X.

Three channel structures 160 included in an odd-numbered channel column between the string separation insulation layer SSLI and the gate stack separation opening WLH and three channel structures 160 included in an even-numbered channel column between the string separation insulation layer SSLI and the gate stack separation opening WLH may be electrically connected to the first through sixth bit lines 180a, 180b, 180c, 180d, 180e, and 180f, respectively.

For example, a first channel structure 160a is included in an odd-numbered channel column and is arranged farthest from the string separation insulation layer SSLI, a second channel structure 160b is arranged apart from the first channel structure 160a in the second horizontal direction Y, and a third channel structure 160c is arranged apart from the second channel structure 160b in the second horizontal direction Y. A fourth channel structure 160d is included in an even-numbered channel column and arranged apart from the first channel structure 160a in the first horizontal direction X and the second horizontal direction Y, a fifth channel structure 160e is arranged apart from the fourth channel structure 160d in the second horizontal direction Y, and a sixth channel structure 160f is arranged apart from the fifth channel structure 160e in the second horizontal direction Y and is closest to the string separation insulation layer SSLI.

According to embodiments, the first segment 180S1 of the first bit line 180a may be arranged over the first channel structure 160a, the second segment 180S2 of the second bit line 180b may be arranged over the second channel structure 160b, the third segment 180S3 of the third bit line 180c may be arranged over the third channel structure 160c, the first segment 180S1 of the fourth bit line 180d may be arranged over the fourth channel structure 160d, the second segment 180S2 of the fifth bit line 180e may be arranged over the fifth channel structure 160e, and the third segment 180S3 of the sixth bit line 180f may be arranged over the sixth channel structure 160f.

According to embodiments, the bit line contacts 170 may include first, second, third, fourth, fifth, and sixth bit line contacts 170a, 170b, 170c, 170d, 170e, and 170f and the first through sixth bit line contacts 170a, 170b, 170c, 170d, 170e, and 170f may be arranged on the first through sixth channel structures 160a, 160b, 160c, 160d, 160e, and 160f, respectively. The first through sixth bit line contacts 170a, 170b, 170c, 170d, 170e, and 170f may be arranged on respective center portions of the first through sixth channel structures 160a, 160b, 160c, 160d, 160e, and 160f in the first horizontal direction X, respectively.

As the bit line contacts 170 are arranged to overlap respective center portions of the channel structures 160, a relatively large contact area between the bit line contacts 170 and the channel structures 160 may be secured, and accordingly, the channel structures 160 and the bit lines 180A may be arranged without forming an additional stud therebetween. For example, an upper surface of each bit line contact 170 may contact a lower surface of each bit line 180A and a lower surface of the bit line contact 170 may contact an upper surface of the channel structure 160.

In general, the number of channel structures 160 arranged in the second horizontal direction Y within one block is limited to four due to a restriction of an electrical connection space with the bit lines 180A. In other words, the block is restricted to a structure in which two channel structures 160 are arranged between the string separation insulation layer SSLI and the gate stack separation opening WLH in the second horizontal direction Y. A method of forming the bit lines 180A by using a DPT has been proposed. In this case, the shapes of the bit lines 180A are limited to a repetitive straight line shape having the same width or the same interval. Thus, an odd-numbered bit line is arranged at a location apart from the center of the first channel structure 160a to the left side and an even-numbered bit line spaced apart from the odd-numbered bit line by a predetermined interval is arranged at a location apart from the center of the second channel structure 160b to the right side. In this case, in a plan view, the center line of each bit line 180A and the center line of each channel structure 160 may not be consistent with each other, and an additional stud needs to be arranged between the channel structure 160 and each bit line contact 170 in order to secure a sufficiently low contact resistance between the channel structure 160 and the bit line contact 170 (or a sufficiently large contact area between the channel structure 160 and the bit line contact 170).

However, according to the above-described embodiments, the bit lines 180A may be formed using a patterning process using EUV exposure, and the bit lines 180A may each be formed to have the first bending portion 180B1 and the second bending portion 180B2. Accordingly, even when 6 or more channel structures 160 are arranged in the second horizontal direction Y within one block (for example, even when three or more channel structures 160 are arranged between the string separation insulation layer SSLI and the gate stack separation opening WLH in the second horizontal direction Y), electrical connection between each of the channel structures 160 and each of the bit lines 180A may be realized. In addition, because each bit line 180A may be arranged on the center portion of each channel structure 160, the semiconductor device 100A may have a relatively low electrical resistance between the bit line 180A and the channel structure 160 (or between each bit line contact 170 and the channel structure 160). Therefore, the semiconductor device 100A may have high integration and good electrical characteristics.

Figure 10:
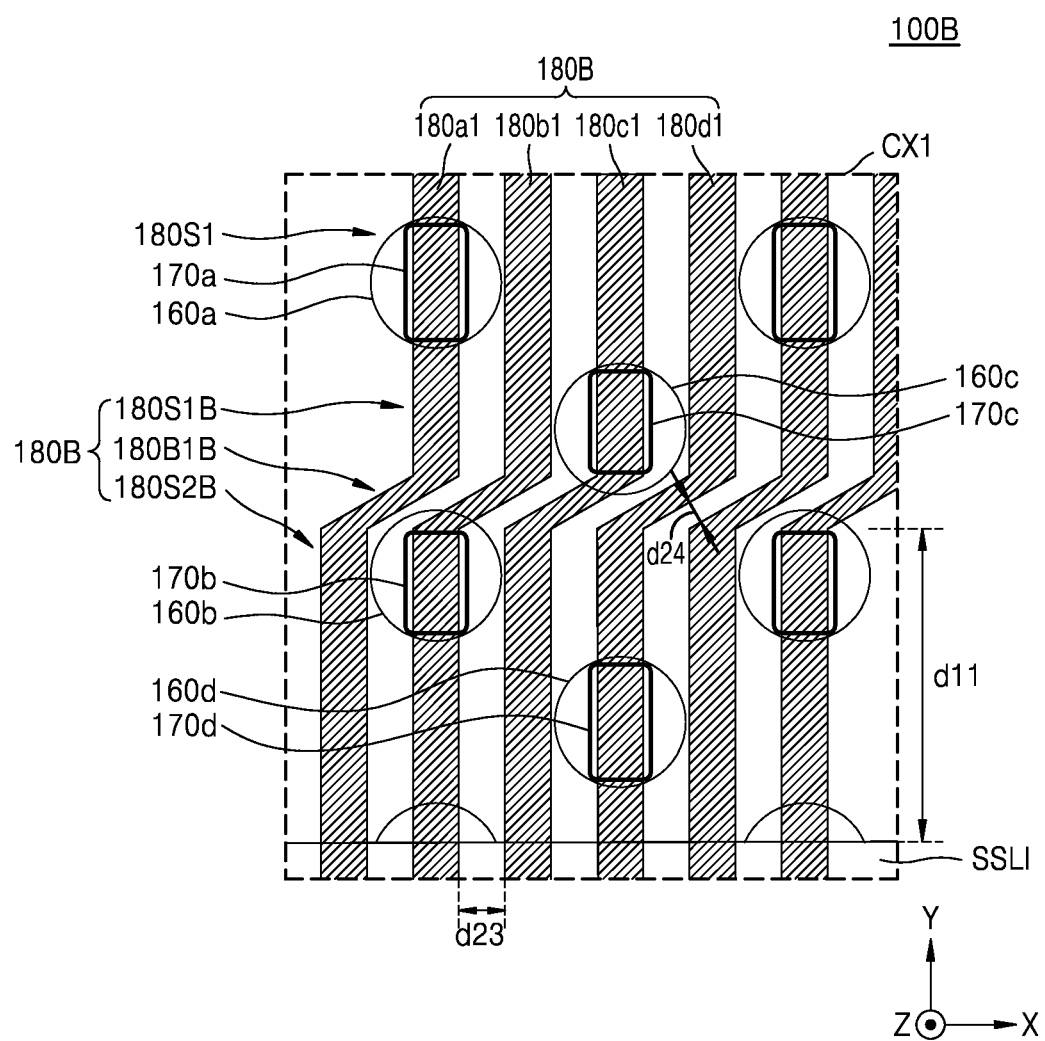
FIG. 10 is a plan view of a semiconductor device according to embodiments.
Figure 11:
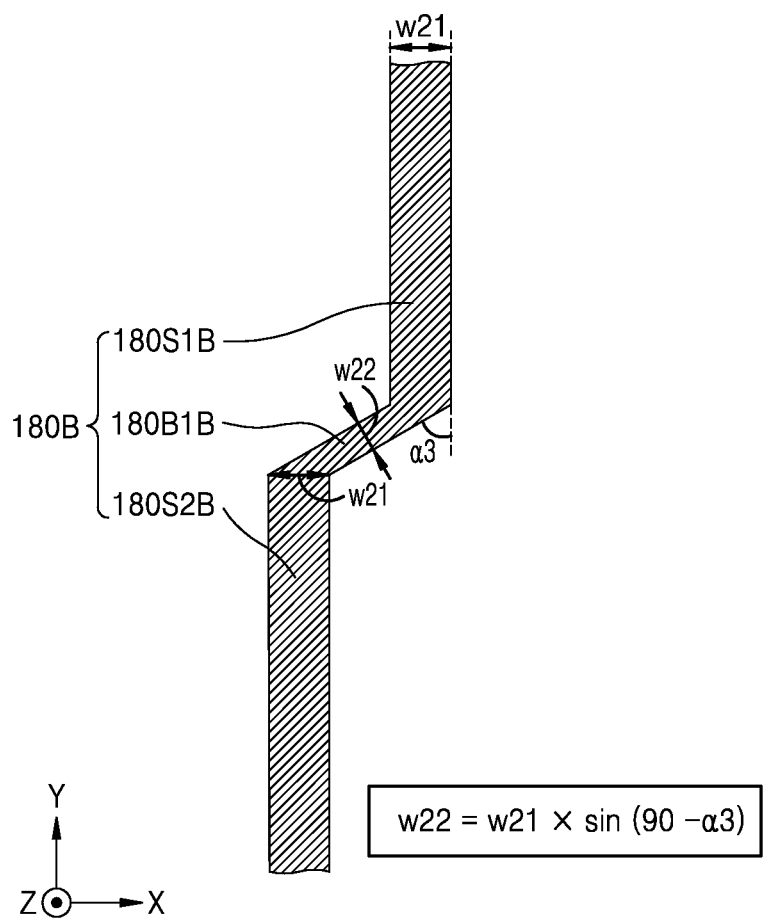
FIG. 11 is an enlarged view of a bit line of FIG. 10.

FIG. 10 is a plan view of a semiconductor device 100B according to embodiments. FIG. 11 is an enlarged view of a bit line 180B of FIG. 10. The same reference numerals in FIGS. 1 through 9 and FIGS. 10 and 11 denote the same elements.

Referring to FIGS. 10 and 11, each bit line 180B may include a first segment 180S1B extending in the second horizontal direction Y, a second segment 180S2B spaced apart from the first segment 180S1B in the first horizontal direction X and extending in the second horizontal direction Y, and a first bending portion 180B1B connecting the first segment 180S1B to the second segment 180S2B.

According to an embodiment, in a plan view, the first bending portion 180B1B may be inclined at an inclination angle α3 of about 20 degrees to about 70 degrees with respect to the second horizontal direction Y and may extend to a predetermined length. According to some embodiments, the first bending portion 180B1B may be inclined at an inclination angle α3 of about 50 degrees to about 70 degrees with respect to the second horizontal direction Y. However, embodiments of the disclosure are not limited thereto.

The first and second segments 180S1B and 180S2B may each have a first thickness w21, and the first bending portion 180B1B may have a second thickness w22 that is less than the first thickness w21. The first thickness w21 may indicate a thickness in a direction perpendicular to an extension direction of each of the first and second segments 180S1B and 180S2B (for example, in the first horizontal direction X), and the second thickness w22 may indicate a thickness in a direction perpendicular to an extension direction of the first bending portion 180B1B (for example, in a diagonal direction inclined with respect to the first horizontal direction X). The second thickness w22 of the first bending portion 180B1B may be determined according to Equation 1 below.

$$w22 = w21 \times \sin(90 - \alpha 3)$$ Equation 1

As shown in FIG. 10, a plurality of bit lines 180B may include first, second, third, and fourth bit lines 180a1, 180b1, 180c1, and 180d1 sequentially arranged in the first horizontal direction X, and the respective first and second segments 180S1B and 180S2B of the first through fourth bit lines 180a1, 180b1, 180c1, and 180d1 may be spaced apart from each other by a first distance d23. For example, the respective first segments 180S1B of the first through fourth bit lines 180a1, 180b1, 180c1, and 180d1 are arranged apart from each other at equal intervals, and the respective second segments 180S2B of the first through fourth bit lines 180a1, 180b1, 180c1, and 180d1 are arranged apart from each other at equal intervals. The respective first bending portion 180B1B of the first through fourth bit lines 180a1, 180b1, 180c1, and 180d1 may be spaced apart from each other at intervals of a second distance d24, and the second distance d24 may be less than the first distance d23.

The respective first bending portion 180B1B of the first through fourth bit lines 180a1, 180b1, 180c1, and 180d1 may have the same locations in the second horizontal direction Y. For example, the first bending portions 180B1B may be spaced apart from the string separation insulation layer SSLI by a first distance d11.

According to embodiments, the bit lines 180B may be formed using a patterning process using EUV exposure and the bit lines 180B may each be formed to have the first bending portions 180B1B having a different thickness than the first and second segments 180S1B and 180S2B. Thus, the bit lines 180B may be arranged on the respective center portions of the channel structures 160 without forming an addition stud. The semiconductor device 100B may have a relatively low electrical resistance between the bit lines 180B and the channel structures 160, and thus, may have good electrical characteristics.

Figure 12:
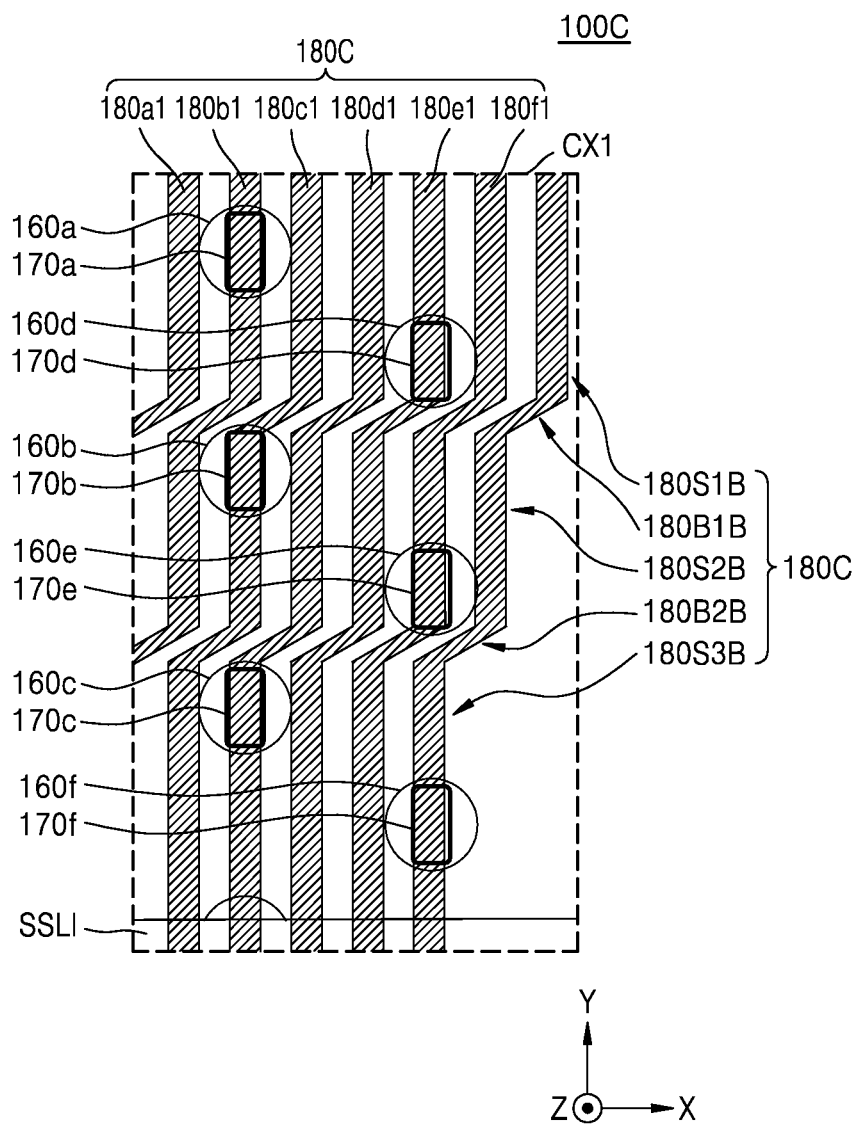
FIG. 12 is a plan view of a semiconductor device according to embodiments.

FIG. 12 is a plan view of a semiconductor device 100C according to embodiments. The same reference numerals in FIGS. 1 through 11 and FIG. 12 denote the same elements.

Referring to FIG. 12, each bit line 180C may include a first segment 180S1B extending in the second horizontal direction Y, a second segment 180S2B spaced apart from the first segment 180S1B in the first horizontal direction X and extending in the second horizontal direction Y, a third segment 180S3B spaced apart from the second segment 180S2B in the first horizontal direction X and extending in the second horizontal direction Y, a first bending portion 180B1B connecting the first segment 180S1B to the second segment 180S2B, and a second bending portion 180B2B connecting the second segment 180S2B to the third segment 180S3B.

The bit lines 180C may include first, second, third, fourth, fifth, and sixth bit lines 180a1, 180b1, 180c1, 180d1, 180e1, and 180f1 sequentially arranged in the first horizontal direction X. The first through sixth bit lines 180a1, 180b1, 180c1, 180d1, 180e1, and 180f1 may be spaced apart from each other at equal intervals. The respective first bending portions 180B1B of the first through sixth bit lines 180a1, 180b1, 180c1, 180d1, 180e1, and 180f1 may have the same locations in the second horizontal direction Y, and the respective second bending portions 180B2B of the first through sixth bit lines 180*a*1, 180*b*1, 180*c*1, 180*d*1, 180*e*1, and 180*f*1 may have the same locations in the second horizontal direction Y.

Figure 13:
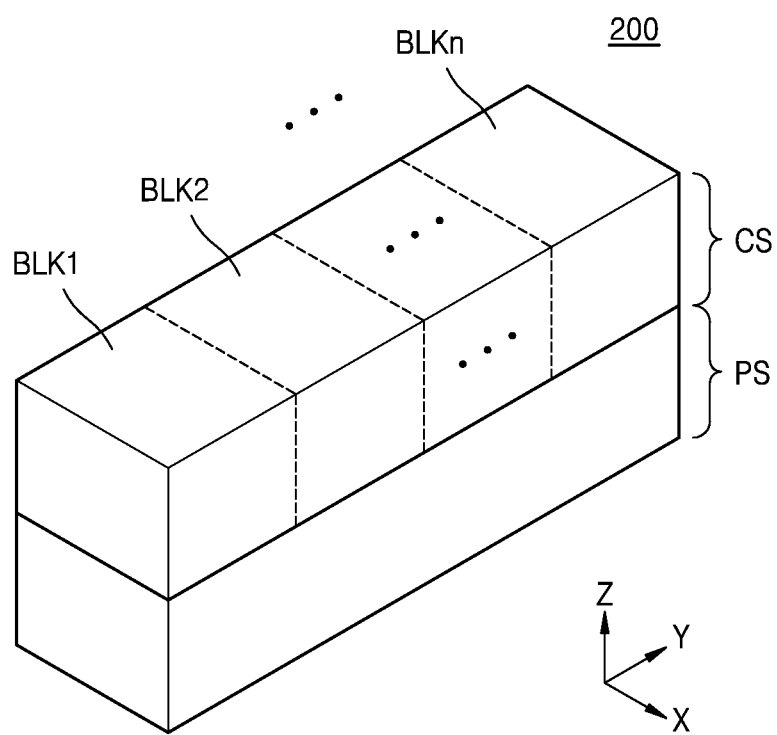
FIG. 13 is a plan view of a semiconductor device according to embodiments.
Figure 14:
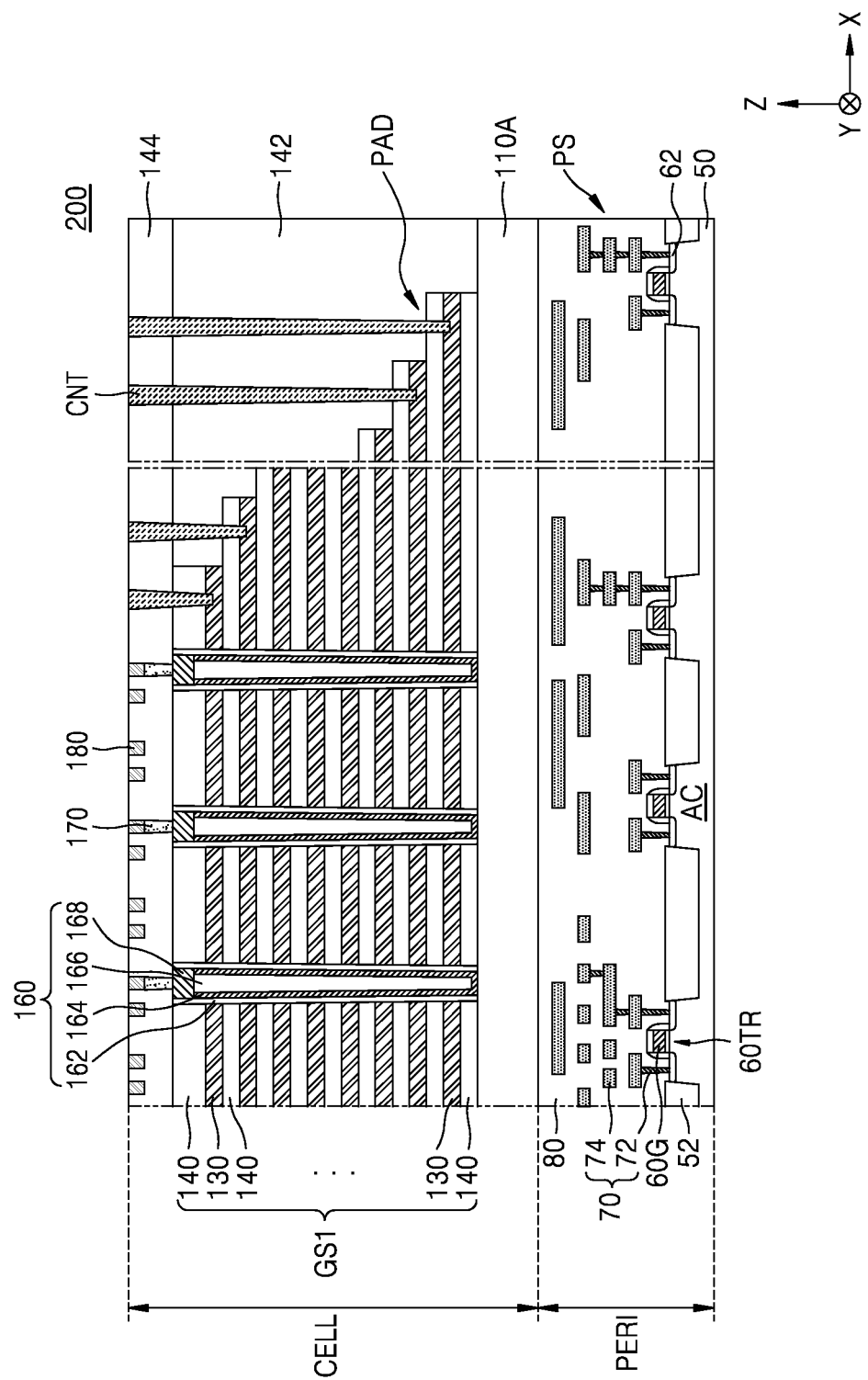
FIG. 14 is a cross-sectional view of the semiconductor device of FIG. 13.

FIG. 13 is a plan view of a semiconductor device 200 according to embodiments. FIG. 14 is a cross-sectional view of the semiconductor device 200 of FIG. 13. The same reference numerals in FIGS. 1 through 12 and FIGS. 13 and 14 denote the same elements.

Referring to FIGS. 13 and 14, the semiconductor device 200 includes a cell array structure CS and a peripheral circuit structure PS overlapping each other in the vertical direction Z. The cell array structure CS may include the memory cell array 20 of FIG. 2, and the peripheral circuit structure PS may include the peripheral circuit 30 of FIG. 1.

The cell array structure CS may include a plurality of memory cell blocks BLK1, BLK2, through BLKn. Each of the plurality of memory cell blocks BLK1, BLK2, through BLKn may include three-dimensionally arranged memory cells. The cell array structure CS may include a cell region CELL, and the cell region CELL may include the memory cell region MCR and the connection region CON described above with reference to FIGS. 3 through 12. The peripheral circuit structure PS may include the peripheral circuit region PERI. Although not shown, the cell region CELL may further include a penetrating electrode region where a plurality of penetrating electrodes (not shown) for electrical connection between the memory cell region MCR and the peripheral circuit region PERI arranged on a lower level than the memory cell region MCR are arranged. The penetrating electrode region may be formed at a boundary between the memory cell region MCR and the connection region CON or within the connection region CON.

The peripheral circuit structure PS may include a peripheral circuit transistor 60TR and a peripheral circuit wiring structure 70 arranged on a substrate 50. In the substrate 50, an active region AC may be defined by an isolation layer 52 and a plurality of peripheral circuit transistors 60TR may be formed on the active region AC. Each of the plurality of peripheral circuit transistors 60TR may include a peripheral circuit gate 60G and a source/drain region 62 arranged in a portion of the substrate 50 on both sides of the peripheral circuit gate 60G.

The substrate 50 may include a semiconductor material, for example, a Group IV semiconductor, a Group III-V compound semiconductor, or a Group II-VI oxide semiconductor. For example, the Group IV semiconductor may include silicon (Si), germanium (Ge), or SiGe. The substrate 50 may be a bulky wafer or an epitaxial layer. According to another embodiment, the substrate 50 may include a silicon-on-insulator (SOI) substrate or a germanium-on-insulator (GeOI) substrate.

The peripheral circuit wiring structure 70 includes a plurality of peripheral circuit contacts 72 and a plurality of peripheral circuit wiring layers 74. An interlayer insulation layer 80 may be arranged on the substrate 50 to cover the peripheral circuit transistor 60TR and the peripheral circuit wiring structure 70. The plurality of peripheral circuit wiring layers 74 may have a multi-layered structure including a plurality of metal layers arranged on different vertical levels. Although FIG. 14 illustrates that the plurality of peripheral circuit wiring layers 74 are all formed at the same height, peripheral circuit wiring layers 74 arranged on some levels (for example, arranged on a topmost level) may be formed higher than peripheral circuit wiring layers 74 arranged on the other levels.

A base structure 110A may be arranged on the interlayer insulation layer 80. According to embodiments, the base structure 110A may function as a source region that provides a current to vertical memory cells formed in the cell array structure CS. According to some embodiments, the base structure 110A may include some regions that function as the common source line CSL of FIG. 2.

According to embodiments, the base structure 110A may include a semiconductor material such as Si, Ge, or SiGe. The first gate stack GS1 may extend in the first horizontal direction X and the second horizontal direction Y parallel to an upper surface of the base structure 110A, on the base structure 110A.

Figure 15:
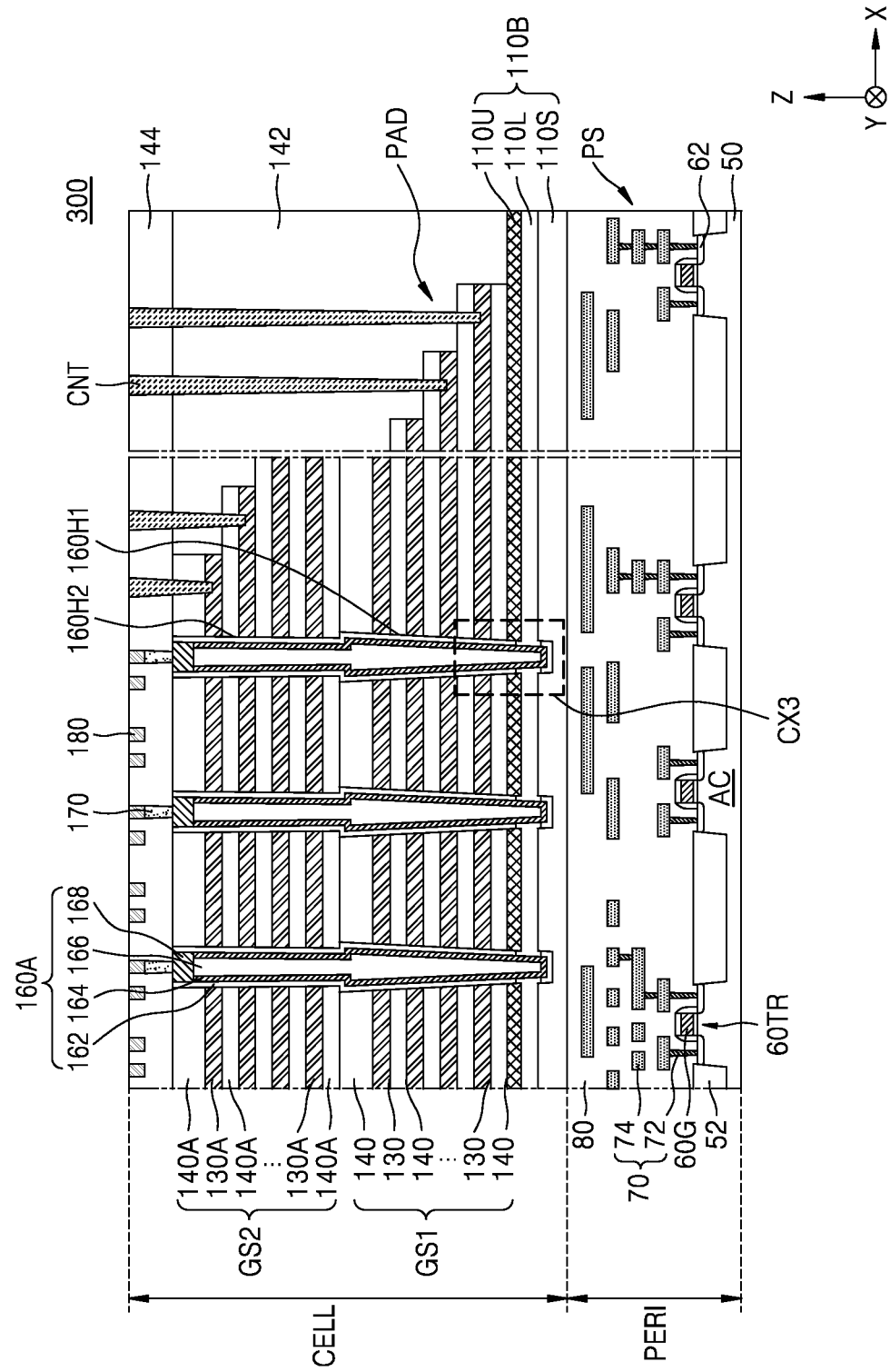
FIG. 15 is a cross-sectional view of a semiconductor device according to embodiments.
Figure 16:
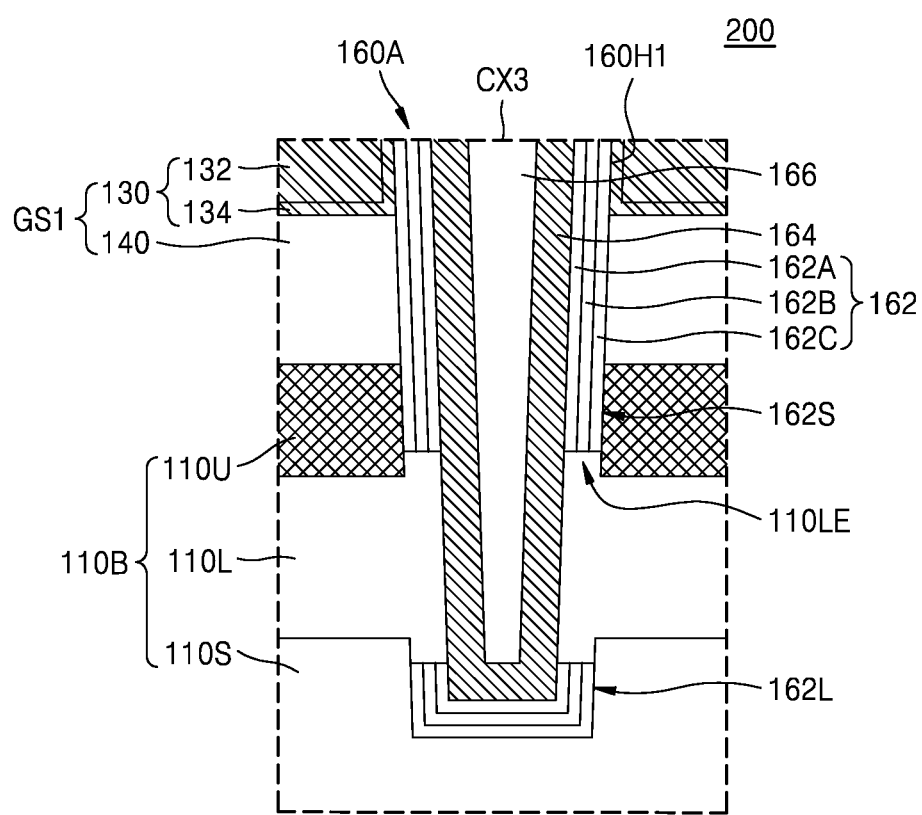
FIG. 16 is an enlarged sectional view of a region CX3 of FIG. 15.

FIG. 15 is a cross-sectional view of a semiconductor device 300 according to embodiments. FIG. 16 is an enlarged sectional view of a portion CX3 of FIG. 15. The same reference numerals in FIGS. 1 through 14 and FIGS. 15 and 16 denote the same elements.

Referring to FIGS. 15 and 16, a base structure 110B may be arranged on the peripheral circuit structure PS and the base structure 110B may include a base substrate 110S, a lower base layer 110L, and an upper base layer 110U sequentially arranged on the interlayer insulation layer 80.

The base substrate 110S may include a semiconductor material such as silicon. The lower base layer 110L may include impurity-doped polysilicon or impurity-undoped polysilicon, and the upper base layer 110U may include impurity-doped polysilicon or impurity-undoped polysilicon. The lower base layer 110L may correspond to the common source line CSL of FIG. 2. The upper base layer 110U may serve as a support layer for preventing collapse or fall of a mold stack in a process of removing a sacrificial material layer (not shown) for forming the lower base layer 110L.

A first gate stack GS1 may be arranged on the base structure 110B, and a second gate stack GS2 may be arranged on the first gate stack GS1. The first gate stack GS1 may include a plurality of first gate electrodes 130 and a plurality of first insulation layers 140 alternating each other, and the second gate stack GS2 may include a plurality of second gate electrodes 130A and a plurality of second insulation layers 140A alternating each other.

A plurality of channel structures 160A may be formed within a first channel hole 160H1 penetrating through the first gate stack GS1 and a second channel hole 160H2 penetrating through the second gate stack GS2. The plurality of channel structures 160A may each have a shape protruding outwards at a boundary between the first channel hole 160H1 and the second channel hole 160H2.

The plurality of channel structures 160A may contact the base substrate 110S by penetrating through the upper base layer 110U and the lower base layer 110L. As shown in FIG. 16, a portion of a gate insulation layer 162 that is on the same level as the lower base layer 110L may be removed and a channel layer 164 may contact an extension 110LE of the lower base layer 110L. A sidewall portion 162S and a bottom portion 162L of the gate insulation layer 162 may be spaced apart from each other with the extension 110LE of the lower base layer 110L therebetween, and because the bottom portion 162L of the gate insulation layer 162 surrounds a bottom surface of the channel layer 164, the channel layer 164 may be electrically connected to the lower base layer 110L instead of directly contacting the base substrate 110S.

Figure 17:
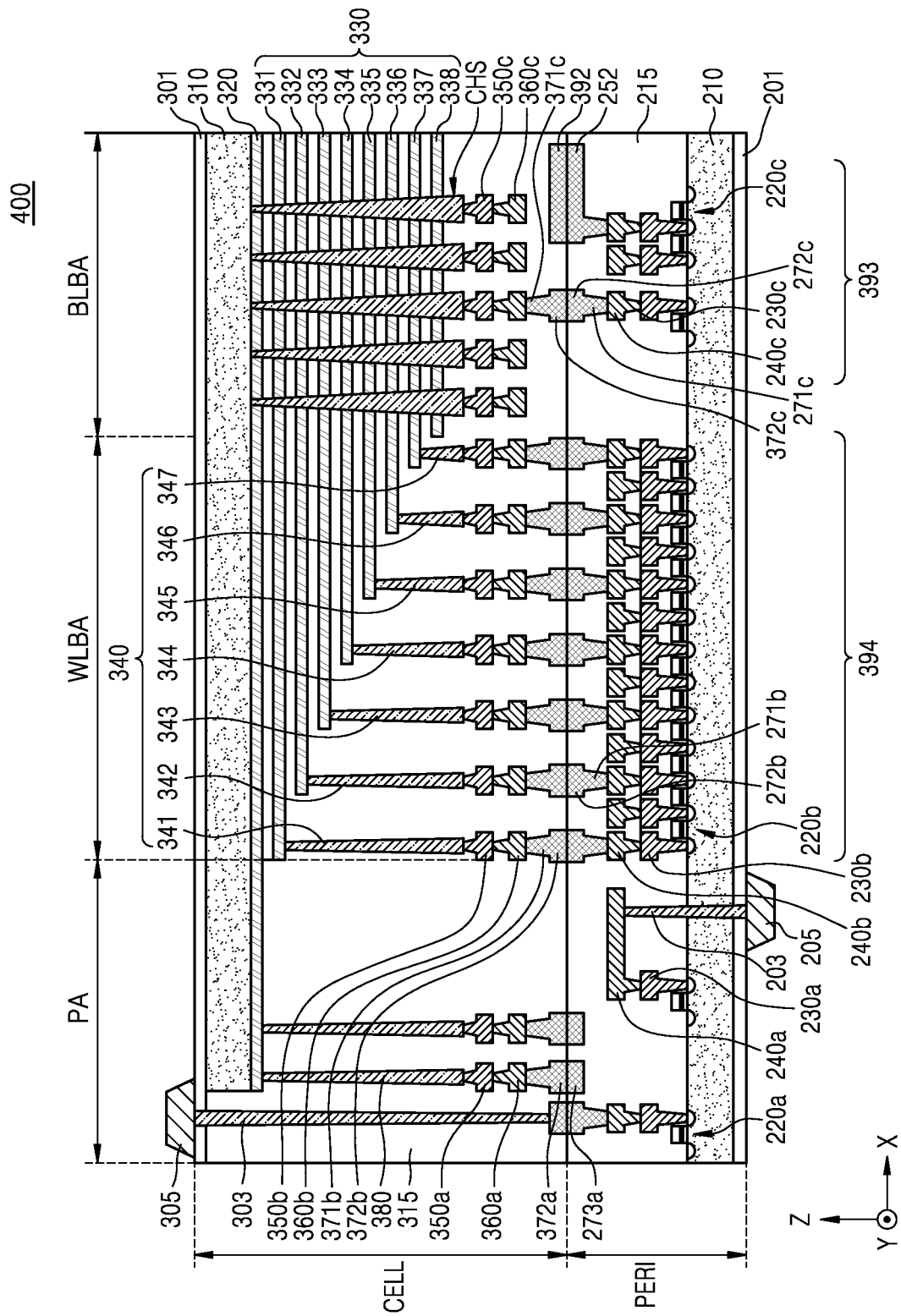
FIG. 17 is a cross-sectional view of a semiconductor device according to embodiments.

FIG. 17 is a cross-sectional view of a semiconductor device 400 according to embodiments.

Referring to FIG. 17, the semiconductor device 400 may be a chip to chip (C2C) structure. The C2C structure may refer to a device formed by manufacturing an upper chip including a cell region CELL on a first wafer, manufacturing a lower chip including a peripheral circuit region PERI on a second wafer, and then connecting the upper chip to the lower chip via bonding. For example, the bonding may refer to a method of electrically connecting a bonding metal formed on a lowermost metal layer of the upper chip to a bonding metal formed on a topmost metal layer of the lower chip. For example, when the bonding metal is formed of copper (Cu), the bonding may be Cu-to-Cu bonding, and the bonding metal may be formed of aluminum (Al) or tungsten (W).

Each of the peripheral circuit region PERI and the cell region CELL of the semiconductor device 400 may include an external pad bonding area PA, a word line bonding area WLBA, and a bit line bonding area BLBA.

The peripheral circuit region PERI may include a first substrate 210, an interlayer insulation layer 215, a plurality of circuit devices 220*a*, 220*b*, and 220*c* formed on the first substrate 210, first metal layers 230*a*, 230*b*, and 230*c* connected to the plurality of circuit devices 220*a*, 220*b*, and 220*c*, respectively, and second metal layers 240*a*, 240*b*, and 240*c* formed on the first metal layers 230*a*, 230*b*, and 230*c*. According to an embodiment, the first metal layers 230*a*, 230*b*, and 230*c* may be formed of tungsten having relatively high electrical specific resistivity and the second metal layers 240*a*, 240*b*, and 240*c* may be formed of copper having relatively low electrical specific resistivity.

In the present specification, only the first metal layers 230*a*, 230*b*, and 230*c* and the second metal layers 240*a*, 240*b*, and 240*c* are illustrated and described. However, embodiments are not limited thereto, and one or more metal layers may be further formed on the second metal layers 240*a*, 240*b*, and 240*c*. At least some of the one or more metal layers formed above the second metal layer 240*a*, 240*b*, and 240*c* may be formed of aluminum or the like having lower electrical specific resistivity than copper used to form the second metal layers 240*a*, 240*b*, and 240*c*.

The interlayer insulation layer 215 may be disposed on the first substrate 210 to cover the plurality of circuit devices 220*a*, 220*b*, and 220*c*, the first metal layers 230*a*, 230*b*, and 230*c*, and the second metal layers 240*a*, 240*b*, and 240*c* and may include an insulation material such as silicon oxide or silicon nitride.

Lower bonding metals 271*b* and 272*b* may be formed on the second metal layer 240*b* of the word line bonding area WLBA. In the word line bonding area WLBA, the lower bonding metals 271*b* and 272*b* of the peripheral circuit region PERI may be electrically connected to upper bonding metals 371*b* and 372*b* of the cell region CELL via bonding and the lower bonding metals 271*b* and 272*b* and the upper bonding metals 371*b* and 372*b* may be formed of aluminum, copper, tungsten, or the like.

The cell region CELL may provide at least one memory block. The cell region CELL may include a second substrate 310 and a common source line 320. On the second substrate 310, a plurality of word lines 331 through 338 (330) may be stacked in a direction perpendicular to an upper surface of the second substrate 310 (e.g., Z-axis direction). String selection lines and a ground selection line may be arranged above and below the plurality of word lines 330, respectively, and the plurality of word lines 330 may be arranged between the string selection lines and the ground selection line(s).

In the bit line bonding area BLBA, a channel structure CHS may extend in the direction perpendicular to the upper surface of the second substrate 310 and may penetrate through the word lines 330, the string selection lines, and the ground selection line(s). The channel structure CHS may include a data storage layer, a channel layer and a buried insulation layer, and the channel layer may be electrically connected to a bit line contact 350*c* and a bit line 360*c*. According to an embodiment, the bit line 360*c* may be formed to have a similar shape to the bit lines 180, 180A, 180B, and 180C of FIGS. 3 through 16.

According to the embodiment of FIG. 17, an area where the channel structure CHS, the bit line 360*c*, and the like are arranged may be defined as the bit line bonding area BLBA. The bit line 360*c* may be electrically connected to circuit devices 220*c* that provide a page buffer 393 in the peripheral circuit region PERI in the bit line bonding area BLBA. For example, the bit line 360*c* may be connected to upper bonding metals 371*c* and 372*c* in the peripheral circuit region PERI and the upper bonding metals 371*c* and 372*c* may be connected to lower bonding metals 271*c* and 272*c* connected to the circuit devices 220*c* of the page buffer 393.

In the word line bonding area WLBA, the word lines 330 may each extend in a second direction (X-axis direction) perpendicular to the first direction and also parallel to the upper surface of the second substrate 310 and may be connected to a plurality of cell contact plugs 341 through 347 (340). The word lines 330 may be connected to the cell contact plugs 340 in pads where at least some of the word lines 330 extend with different lengths in the second direction and are provided. A first metal layer 350*b* and a second metal layer 360*b* may be sequentially connected to upper ends of the cell contact plugs 340 connected to the word lines 330. In the word line bonding area WLBA, the cell contact plugs 340 may be connected to the peripheral circuit region PERI through the upper bonding metals 371*b* and 372*b* of the cell region CELL and the lower bonding metals 271*b* and 272*b* of the peripheral circuit region PERI.

The cell contact plugs 340 may be electrically connected to circuit devices 220*b* that provide a row decoder 394 in the peripheral circuit region PERI. According to an embodiment, an operating voltage of the circuit devices 220*b* forming the row decoder 394 may be different from an operating voltage of the circuit devices 220*c* forming the page buffer 393. For example, the operating voltage of the circuit devices 220*c* forming the page buffer 393 may be greater than the operating voltage of the circuit devices 220*b* forming the row decoder 394.

In the external pad bonding area PA, a common source line contact plug 380 may be disposed. The common source line contact plug 380 may be formed of a conductive material such as metal, a metal compound, or polysilicon and may be electrically connected to the common source line 320. A first metal layer 350*a* and a second metal layer 360*a* may be sequentially stacked above the common source line contact plug 380. For example, an area where the common source line contact plug 380, the first metal layer 350*a*, and the second metal layer 360*a* are arranged may be defined as the external pad bonding area PA.

In the external pad bonding area PA, first and second I/O pads 205 and 305 may be arranged. Referring to FIG. 17, a lower insulation layer 201 covering a lower surface of the first substrate 210 may be formed below the first substrate 210 and the first I/O pad 205 may be formed on the lower insulation layer 201. The first I/O pad 205 may be connected to at least one of the plurality of circuit devices 220*a*, 220*b*, and 220*c* arranged in the peripheral circuit region PERI through a first I/O contact plug 203 and may be separated from the first substrate 210 by the lower insulation layer 201. A lateral surface insulation layer may be arranged between the first I/O contact plug 203 and the first substrate 210 and may electrically separate the first I/O contact plug 203 from the first substrate 210.

Referring to FIG. 17, an upper insulation layer 301 covering an upper surface of the second substrate 310 may be formed above the second substrate 310 and the second I/O pad 305 may be arranged on the upper insulation layer 301. The second I/O pad 305 may be connected to at least one of the plurality of circuit devices 220a, 220b, and 220c arranged in the peripheral circuit region PERI through a second I/O contact plug 303. According to some embodiments, the second I/O pad 305 may be electrically connected to the circuit device 220a.

According to embodiments, the second substrate 310, the common source line 320, and the like may not be arranged in an area where the second I/O contact plug 303 is arranged. The second I/O pad 305 may not overlap with the word lines 330 in a third direction (e.g., Z-axis direction). Referring to FIG. 17, the second I/O contact plug 303 may be separated from the second substrate 310 in a direction parallel to the upper surface of the second substrate 310 and may be connected to the second I/O pad 305 by penetrating through the interlayer insulation layer 315 of the cell region CELL.

According to embodiments, the first I/O pad 205 and the second I/O pad 305 may be selectively formed. For example, the semiconductor device 400 may include only the first I/O pad 205 arranged above the first substrate 210 or may include only the second I/O pad 305 arranged above the second substrate 310. Alternatively, the semiconductor device 400 may include both the first I/O pad 205 and the second I/O pad 305.

In the external pad bonding area PA and the bit line bonding area BLBA included in each of the cell region CELL and the peripheral circuit region PERI, a metal pattern of a lowermost metal layer may exist as a dummy pattern or the lowermost metal layer may be empty.

In the external pad bonding area PA, the semiconductor device 400 may form a lower metal pattern 273a on the topmost metal layer of the peripheral circuit region PERI in correspondence with an upper metal pattern 372a formed on the lowermost metal layer of the cell region CELL, the lower metal pattern 273a having the same shape as the upper metal pattern 372a of the cell region CELL. The lower metal pattern 273a formed in the topmost metal layer of the peripheral circuit region PERI may not be connected to a separate contact in the peripheral circuit region PERI. Similarly, in the external pad bonding area PA, the semiconductor device 400 may form an upper metal pattern 372a on the lowermost metal layer of the cell region CELL in correspondence with a lower metal pattern 273a formed on the topmost metal layer of the peripheral circuit region PERI, the upper metal pattern having the same shape as the lower metal pattern 273a of the peripheral circuit region PERI.

The lower bonding metals 271b and 272b may be formed on the second metal layer 240b of the word line bonding area WLBA. In the word line bonding area WLBA, the lower bonding metals 271b and 272b of the peripheral circuit region PERI may be electrically connected to the upper bonding metals 371b and 372b of the cell region CELL via bonding.

In the bit line bonding area BLBA, the semiconductor device 400 may form an upper metal pattern 392 on the lowermost metal layer of the cell region CELL in correspondence with a lower metal pattern 252 formed on the topmost metal layer of the peripheral circuit region PERI, the upper metal pattern 392 having the same shape as the lower metal pattern 252 of the peripheral circuit region PERI. No contact may be formed on the upper metal pattern 392 formed on the lowermost metal layer of the cell region CELL.

Figure 18:
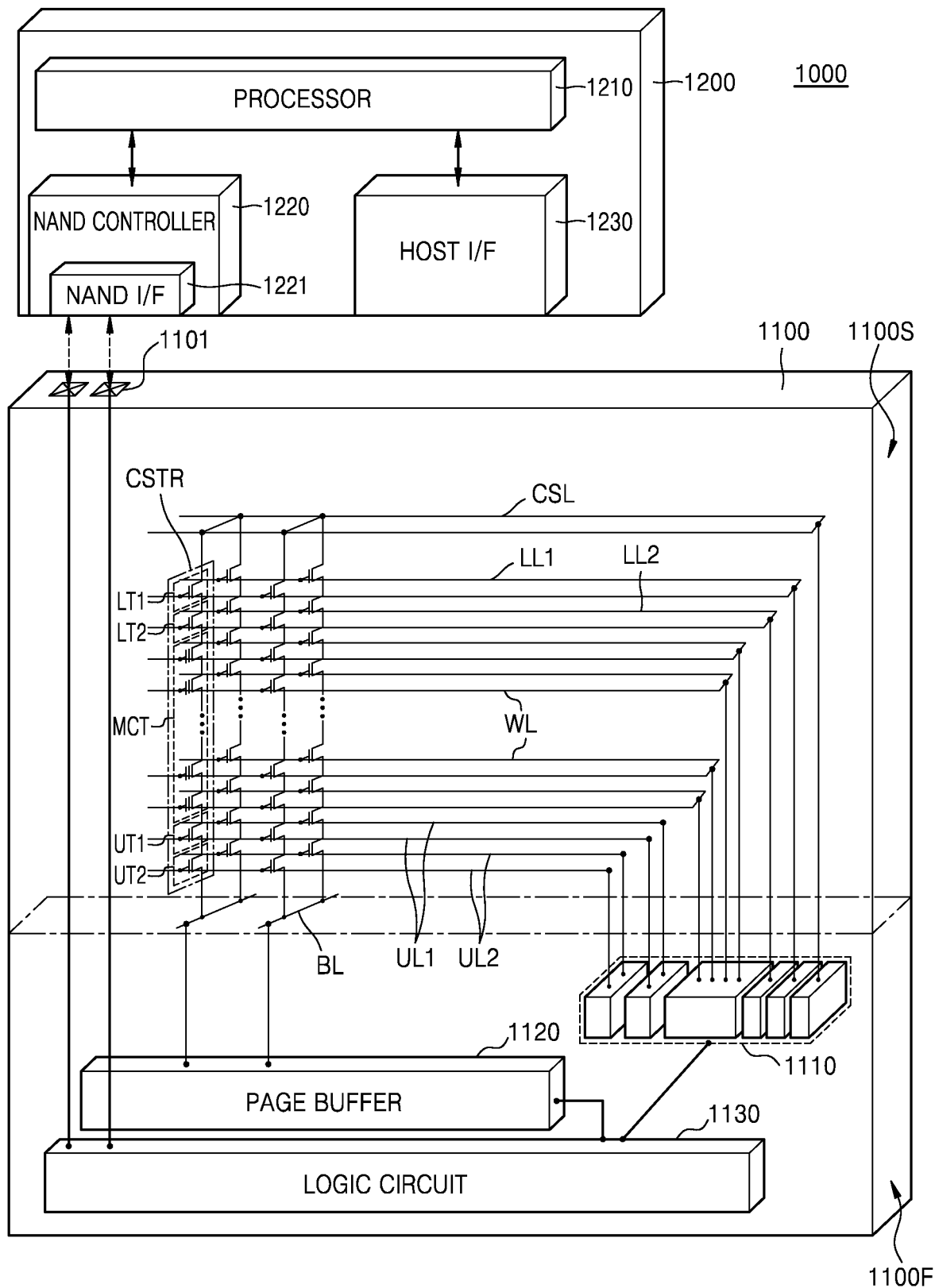
FIG. 18 schematically illustrating a data storage system including a semiconductor device, according to embodiments.

FIG. 18 schematically illustrating a data storage system 1000 including a semiconductor device, according to embodiments.

Referring to FIG. 18, the data storage system 1000 may include one or more semiconductor devices 1100 and a memory controller 1200 electrically connected to the semiconductor devices 1100. The data storage system 1000 may be, for example, a solid state drive (SSD) device, a universal serial bus (USB), a computing system, a medical device, or a communication device each including the at least one semiconductor device 1100.

The semiconductor device 1100 may be a non-volatile semiconductor device. For example, the semiconductor device 1100 may be a NAND flash semiconductor device including one of the semiconductor devices 10, 100, 100A, 100B, 100C, 200, 300, and 400 of FIGS. 1 through 17. The semiconductor device 1100 may include a first structure 1100F and a second structure 1100S on the first structure 1100F. The first structure 1100F may be a peripheral circuit structure including a row decoder 1110, a page buffer 1120, and a logic circuit 1130.

The second structure 1100S may be a memory cell structure including a plurality of bit lines BL, a common source line CSL, a plurality of word lines WL, first and second string selection lines UL1 and UL2, first and second ground selection lines LL1 and LL2, and a plurality of memory cell strings CSTR between the bit line BL and the common source line CSL.

In the second structure 1100S, each of the plurality of memory cell strings CSTR may include ground selection transistors LT1 and LT2 adjacent to the common source line CSL, string selection transistors UT1 and UT2, and a plurality of memory cell transistors MCT between the ground selection transistors LT1 and LT2 and the string selection transistors UT1 and UT2. The number of ground selection transistors LT1 and LT2 and the number of string selection transistors UT1 and UT2 may vary according to embodiments.

According to embodiments, the plurality of ground selection lines LL1 and LL2 may be connected to gate electrodes of the ground selection transistors LT1 and LT2. The plurality of word lines WL may be connected to gate electrodes of the plurality of memory cell transistors MCT. The plurality of string selection lines UL1 and UL2 may be connected to gate electrodes of the string selection transistors UT1 and UT2, respectively.

The common source line CSL, the plurality of ground selection lines LL1 and LL2, the plurality of word lines WL, and the plurality of string selection lines UL1 and UL2 may be connected to the row decoder 1110. The plurality of bit lines BL may be electrically connected to the page buffer 1120.

The semiconductor device 1100 may communicate with the memory controller 1200 through an I/O pad 1101 electrically connected to the logic circuit 1130. The I/O pad 1101 may be electrically connected to the logic circuit 1130.

The memory controller 1200 may include a processor 1210, a NAND controller 1220, and a host interface (I/F) 1230. According to embodiments, the data storage system 1000 may include a plurality of semiconductor devices 1100. In this case, the memory controller 1200 may control the plurality of semiconductor devices 1100.

The processor 1210 may control an overall operation of the data storage system 1000 including the memory controller 1200. The processor 1210 may operate according to predetermined firmware and may access the semiconductor device 1100 by controlling the NAND controller 1220. The NAND controller 1220 may include a NAND I/F 1221 that processes communication with the semiconductor device 1100. A control command for controlling the semiconductor device 1100, data to be recorded in the plurality of memory cell transistors MCT of the semiconductor device 1100, and data to be read from the plurality of memory cell transistors MCT of the semiconductor device 1100 may be transmitted through the NAND I/F 1221. The host I/F 1230 may provide a communication function between the data storage system 1000 and an external host. When a control command is received from the external host through the host I/F 1230, the processor 1210 may control the semiconductor device 1100 in response to the control command.

Figure 19:
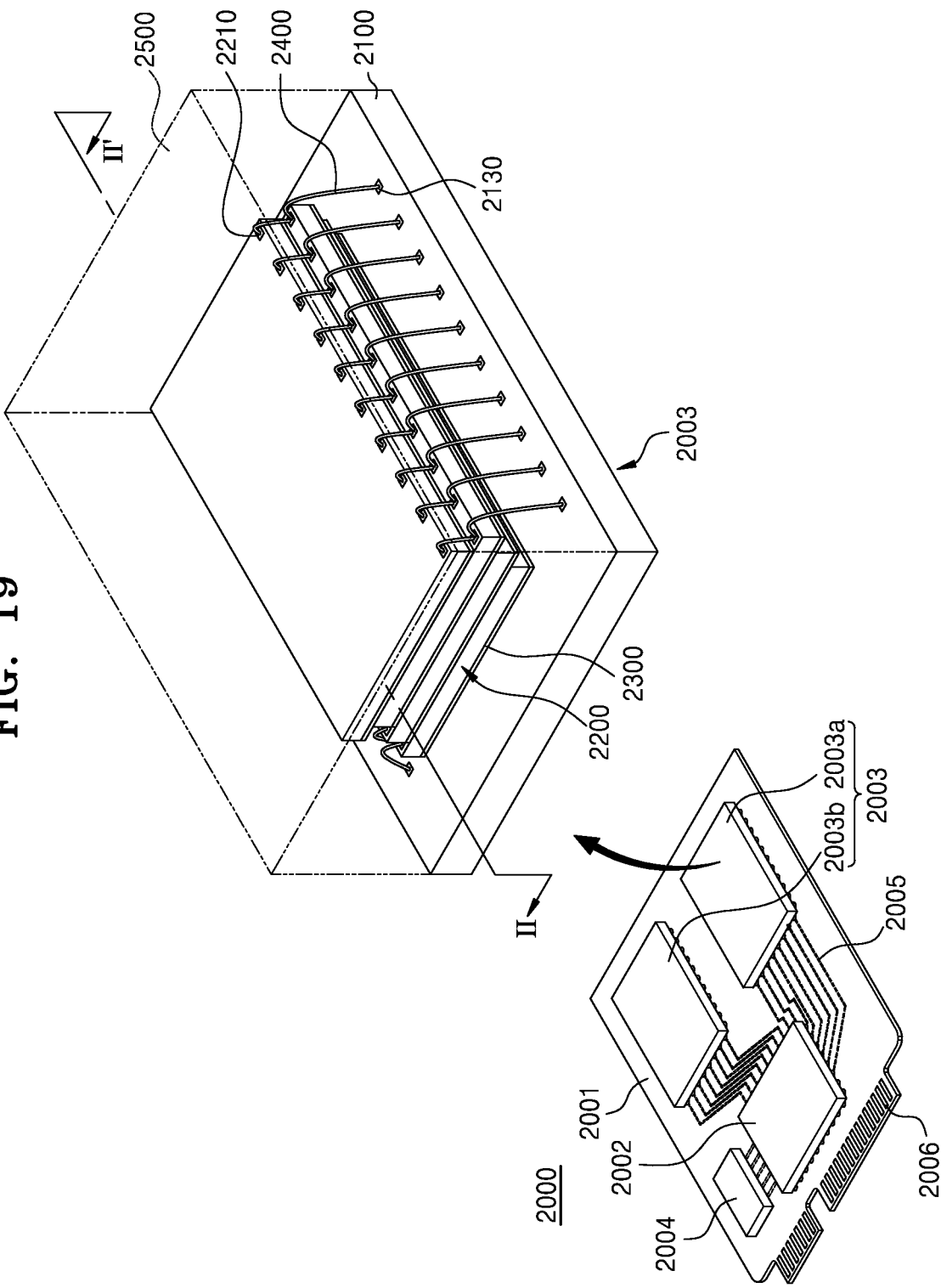
FIG. 19 is a schematic perspective view of a data storage system including a semiconductor device, according to embodiments.

FIG. 19 is a schematic perspective view of a data storage system 2000 including a semiconductor device, according to embodiments.

Referring to FIG. 19, the data storage system 2000 may include a main substrate 2001, a memory controller 2002 mounted on the main substrate 2001, one or more semiconductor packages 2003, and a DRAM 2004. The semiconductor package 2003 and the DRAM 2004 may be connected to the memory controller 2002 by a plurality of wiring patterns 2005 formed on the main substrate 2001.

The main substrate 2001 may include a connector 2006 including a plurality of pins coupled with the external host. In the connector 2006, the number of pins and a layout of the plurality of pins may vary according to a communication I/F between the data storage system 2000 and the external host. According to embodiments, the data storage system 2000 may communicate with the external host according to one of I/Fs such as a USB, a Peripheral Component Interconnect Express (PCI-Express), Serial Advanced Technology Attachment (SATA), and Universal Flash Storage (UFS) M-Phy. According to embodiments, the data storage system 2000 may operate with power received from the external host through the connector 2006. The data storage system 2000 may further include a power management integrated circuit (PMIC) that distributes the power received from the external host into the memory controller 2002 and the semiconductor package 2003.

The memory controller 2002 may write data to the semiconductor package 2003 or read data from the semiconductor package 2003, and an operating speed of the data storage system 2000 may improve.

The DRAM 2004 may be a buffer memory for relieving a speed difference between the semiconductor package 2003, which is a data storage space, and the external host. The DRAM 2004 included in the data storage system 2000 may operate as a sort of cache memory and may provide a space for temporarily storing data, in an operation of controlling the semiconductor package 2003. When the DRAM 2004 is included in the data storage system 2000, the memory controller 2002 may further include a DRAM controller for controlling the DRAM 2004, in addition to a NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, a plurality of semiconductor chips 2200 on the package substrate 2100, an attachment layer 2300 arranged on a lower surface of each of the plurality of semiconductor chips 2200, a connection structure 2400 electrically connecting the plurality of semiconductor chips 2200 to the package substrate 2100, and a molding layer 2500 covering the plurality of semiconductor chips 2200 and the connection structure 2400 on the package substrate 2100.

The package substrate 2100 may be a printed circuit board (PCB) including a plurality of package upper pads 2130. Each of the plurality of semiconductor chips 2200 may include I/O pads 2210. The I/O pads 2210 may correspond to the I/O pads 1101 of FIG. 18. Each of the plurality of semiconductor chips 2200 may include at least one of the semiconductor devices 10, 100, 100A, 100B, 100C, 200, 300, and 400 of FIGS. 1 through 17.

According to embodiments, the connection structure 2400 may be a bonding wire that electrically connects the I/O pads 2210 to package upper pads 2130. Accordingly, in the first and second semiconductor packages 2003a and 2003b, the plurality of semiconductor chips 2200 may be electrically connected to each other by using a bonding wire method, and may be electrically connected to the package upper pads 2130 of the package substrate 2100. According to embodiments, in the first and second semiconductor packages 2003a and 2003b, the plurality of semiconductor chips 2200 may be electrically connected to each other by a connection structure including a through silicon via (TSV) instead of the connection structure 2400 of the bonding wire method.

According to embodiments, the memory controller 2002 and the plurality of semiconductor chips 2200 may be included in one package. According to an embodiment, the memory controller 2002 and the plurality of semiconductor chips 2200 may be mounted on an interposer substrate separate from the main substrate 2001, and the memory controller 2002 and the plurality of semiconductor chips 2200 may be connected to each other by wiring formed on the interposer substrate.

Figure 20:
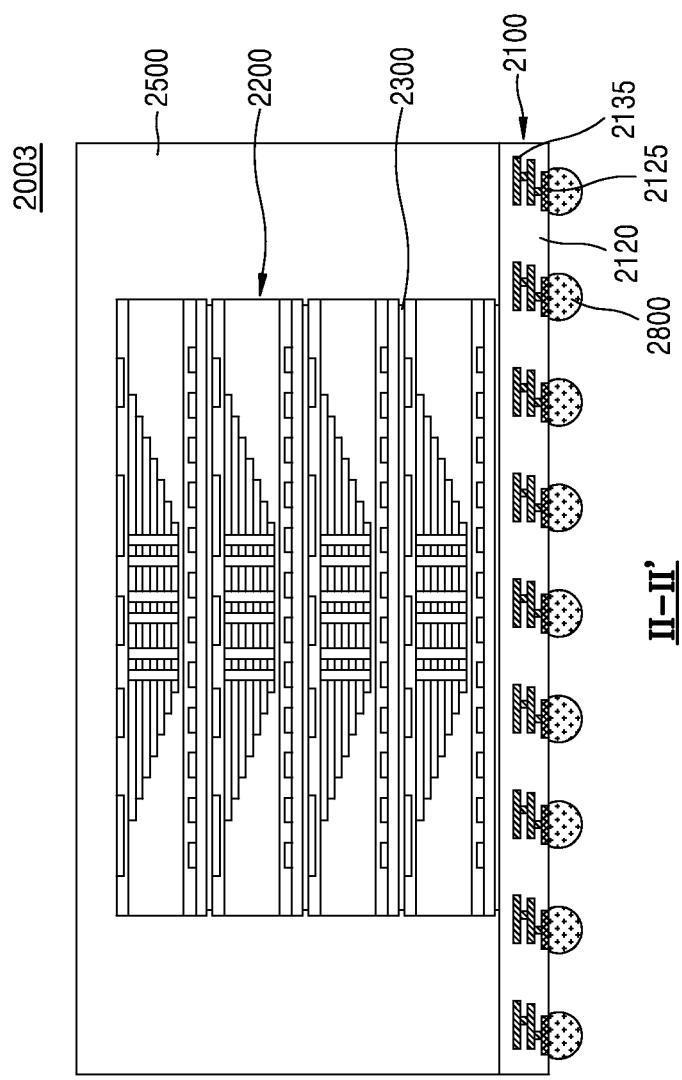
FIG. 20 is a schematic cross-sectional view of semiconductor packages according to embodiments.

FIG. 20 is a schematic cross-sectional view of semiconductor packages 2003 according to embodiments. FIG. 20 illustrates a cross-section of the semiconductor packages 2003 taken along line II-II' in FIG. 19.

Referring to FIG. 20, in the semiconductor packages 2003, a package substrate 2100 may be a PCB. The package substrate 2100 may include a package substrate body portion 2120, a plurality of package upper pads 2130 (see FIG. 19) arranged on an upper surface of the package substrate body portion 2120, a plurality of lower pads 2125 arranged on a lower surface of the package substrate body portion 2120 or exposed through the lower surface thereof, and a plurality of internal wires 2135 that electrically connecting the plurality of package upper pads 2130 of FIG. 19 to the plurality of lower pads 2125 within the package substrate body portion 2120. As shown in FIG. 20, the plurality of package upper pads 2130 may be electrically connected to the plurality of connection structures 2400 of FIG. 19. As shown in FIG. 20, the plurality of lower pads 2125 may be connected to a plurality of wiring patterns 2005 on the main substrate 2001 of the data storage system 2000 of FIG. 19 through a plurality of conductive bumps 2800. Each of the plurality of semiconductor chips 2200 may include at least one of the semiconductor devices 10, 100, 100A, 100B, 100C, 200, 300, and 400 of FIGS. 1 through 17.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the disclosure has been particularly shown and described with reference to embodiments thereof, it will be understood that various changes in form and details may be made therein without departing from the spirit and scope of the following claims.

What is claimed is:

1. A semiconductor device comprising:
a plurality of gate electrodes arranged on a substrate so as to be spaced apart from each other in a vertical direction perpendicular to an upper surface of the substrate;
a plurality of channel structures each penetrating through the plurality of gate electrodes and extending in the vertical direction;
a string separation insulation layer penetrating through one or more topmost gate electrodes and extending in a first horizontal direction parallel to the upper surface of the substrate;
a plurality of bit line contacts arranged on the plurality of channel structures; and
a plurality of bit lines arranged on the plurality of bit line contacts, each of the bit lines comprising:
a first segment extending in a second horizontal direction perpendicular to the first horizontal direction;
a second segment spaced apart from the first segment in the first horizontal direction and extending in the second horizontal direction; and
a first bending portion connecting the first segment to the second segment;
a third segment spaced apart from the second segment in the first horizontal direction and extending in the second horizontal direction; and
a second bending portion connecting the second segment to the third segment,
wherein the plurality of channel structures comprises:
a first channel structure; and
a second channel structure spaced apart from the first channel structure in the second horizontal direction,
the plurality of bit lines comprises:
a first bit line having the first segment arranged on the first channel structure; and
a second bit line having the second segment arranged on the second channel structure, and
in a plan view, the second channel structure is disposed between the first segment of the first bit line and the third segment of the first bit line.

2. The semiconductor device of claim 1, wherein:
a bottom surface of each of the plurality of bit line contacts is in contact with an upper surface of a corresponding channel structure among the plurality of channel structures,
the plurality of bit line contacts have a first width in the second horizontal direction and have a second width in the first horizontal direction, and
the second width is less than the first width.

3. The semiconductor device of claim 1, wherein the first bending portion extends at an inclination angle of about 20 degrees to about 70 degrees with respect to the second horizontal direction.

4. The semiconductor device of claim 1, wherein in the plan view:
the first bending portion of the first bit line and the first bending portion of the second bit line are arranged between the first channel structure and the second channel structure,
the first bending portion of the first bit line extends at an inclination angle of about 20 degrees to about 70 degrees with respect to the second horizontal direction, and
the first bending portion of the second bit line extends at an inclination angle of about 20 degrees to about 70 degrees with respect to the second horizontal direction.

5. The semiconductor device of claim 1, wherein a first distance between the first bending portion of the first bit line and the string separation insulation layer in the second horizontal direction is greater than a second distance between the first bending portion of the second bit line and the string separation insulation layer in the second horizontal direction.

6. The semiconductor device of claim 1, wherein:
the plurality of bit line contacts comprises:
a first bit line contact arranged on the first channel structure; and
a second bit line contact arranged on the second channel structure, and in the plan view:
a center line of the first channel structure in the first horizontal direction overlaps the first bit line contact, and
a center line of the second channel structure in the first horizontal direction overlaps the second bit line contact.

7. The semiconductor device of claim 1, wherein a distance between the first bending portion of the first bit line and the string separation insulation layer in the second horizontal direction is substantially equal to a distance between the first bending portion of the second bit line and the string separation insulation layer in the second horizontal direction.

8. A semiconductor device comprising:
a plurality of gate electrodes arranged on a substrate so as to be spaced apart from each other in a vertical direction perpendicular to an upper surface of the substrate;
a plurality of channel structures each penetrating through the plurality of gate electrodes and extending in the vertical direction;
a string separation insulation layer penetrating through two topmost gate electrodes and extending in a first horizontal direction; and
a plurality of bit lines arranged on the plurality of channel structures, each of the bit lines comprising:
a first segment extending in a second horizontal direction perpendicular to the first horizontal direction;

a second segment spaced apart from the first segment in the first horizontal direction and extending in the second horizontal direction;
a first bending portion connecting the first segment to the second segment;
a third segment spaced apart from the second segment in the first horizontal direction and extending in the second horizontal direction; and
a second bending portion connecting the second segment to the third segment,
wherein in a plan view, the second segment of a second bit line of the plurality of bit lines is disposed between the first segment and the third segment of a first bit line of the plurality of bit lines such that the second segment of the second bit line overlaps one or more of the plurality of channel structures.

9. The semiconductor device of claim 8, wherein the first bending portion extends at an inclination angle of about 20 degrees to about 70 degrees with respect to the second horizontal direction.

10. The semiconductor device of claim 8, further comprising:
a plurality of bit line contacts arranged on the plurality of channel structures, respectively, wherein:
an upper surface of each of the plurality of bit line contacts is in contact with a bottom surface of a corresponding bit line among the plurality of bit lines, and
a bottom surface of each of the plurality of bit line contacts is in contact with an upper surface of a corresponding channel structure among the plurality of channel structures.

11. The semiconductor device of claim 10, wherein:
the plurality of bit line contacts have a first width in the first horizontal direction and have a second width in the second horizontal direction, and
the second width is greater than the first width.

12. The semiconductor device of claim 10, wherein:
the plurality of channel structures comprises:
a first channel structure; and
a second channel structure spaced apart from the first channel structure in the second horizontal direction,
the first segment of the first bit line is arranged on the first channel structure,
the second segment of the second bit line is arranged on the second channel structure, and
in the view, the first bending portion of the first bit line and the first bending portion of the second bit line are arranged between the first channel structure and the second channel structure.

13. The semiconductor device of claim 12, wherein:
the plurality of bit line contacts comprises:
a first bit line contact arranged on the first channel structure; and
a second bit line contact arranged on the second channel structure, and in a plan view:
a center line of the first channel structure in the first horizontal direction overlaps the first bit line contact, and
a center line of the second channel structure in the first horizontal direction overlaps the second bit line contact.

14. The semiconductor device of claim 8, wherein:
the first segment of the first bit line is parallel to the first segment of the second bit line, and
the first bending portion of the first bit line is parallel to the first bending portion of the second bit line.

15. The semiconductor device of claim 8, wherein a first distance between the first bending portion of the first bit line and the string separation insulation layer in the second horizontal direction is greater than a second distance between the first bending portion of the second bit line and the string separation insulation layer in the second horizontal direction.

16. The semiconductor device of claim 8, wherein:
the plurality of channel structures comprises:
a first channel structure;
a second channel structure spaced apart from the first channel structure in the second horizontal direction;
a third channel structure spaced apart from the first channel structure in the second horizontal direction and the first horizontal direction; and
a fourth channel structure spaced apart from the third channel structure in the second horizontal direction,
the plurality of bit lines comprises the first bit line, the second bit line, a third bit line, and a fourth bit line arranged side by side,
the first segment of the first bit line is arranged on the first channel structure,
the second segment of the second bit line is arranged on the second channel structure,
the first segment of the third bit line is arranged on the third channel structure, and
the second segment of the fourth bit line is arranged on the fourth channel structure.

17. The semiconductor device of claim 16, wherein:
a first distance between the first bending portion of the first bit line and the string separation insulation layer in the second horizontal direction is greater than a second distance between the first bending portion of the second bit line and the string separation insulation layer in the second horizontal direction, and
a third distance between the first bending portion of the third bit line and the string separation insulation layer in the second horizontal direction is greater than a fourth distance between the first bending portion of the fourth bit line and the string separation insulation layer in the second horizontal direction.

18. The semiconductor device of claim 8, wherein a distance between the first bending portion of the first bit line and the string separation insulation layer in the second horizontal direction is substantially equal to a distance between the first bending portion of the second bit line and the string separation insulation layer in the second horizontal direction.

19. The semiconductor device of claim 16, wherein:
the plurality of channel structures comprises a first channel structure, a second channel structure, and a third channel structure arranged side by side in a straight line in the second horizontal direction,
the first segment of the first bit line is arranged on the first channel structure,
the second segment of the second bit line is arranged on the second channel structure, and
the third segment of the third bit line is arranged on the third channel structure.

20. An electronic system comprising:
a main substrate;
a semiconductor device on the main substrate; and
a controller arranged on the main substrate and electrically connected to the semiconductor device, wherein:

the semiconductor device comprises:
- a plurality of gate electrodes arranged on a substrate so as to be spaced apart from each other in a vertical direction perpendicular to an upper surface of the substrate;
- a plurality of channel structures each penetrating through the plurality of gate electrodes and extending in the vertical direction;
- a string separation insulation layer penetrating through one or more topmost gate electrodes and extending in a first horizontal direction;
- a plurality of bit lines arranged on the plurality of channel structures, each of the bit lines comprising:
    - a first segment extending in a second horizontal direction perpendicular to the first horizontal direction,
    - a second segment spaced apart from the first segment in the first horizontal direction and extending in the second horizontal direction,
    - a first bending portion connecting the first segment to the second segment,
    - a third segment spaced apart from the second segment in the first horizontal direction and extending in the second horizontal direction, and
    - a second bending portion connecting the second segment to the third segment;
- a peripheral circuit electrically connected to the plurality of gate electrodes and the plurality of bit lines; and
- an input/output pad electrically connected to the peripheral circuit, and the plurality of channel structures comprises:
- a first channel structure, and
- a second channel structure spaced apart from the first channel structure in the second horizontal direction, the plurality of bit lines comprises:
- a first bit line having the first segment arranged on the first channel structure, and
- a second bit line having the second segment arranged on the second channel structure, and
- in a plan view, the second channel structure is disposed between the first segment of the first bit line and the third segment of the first bit line.

* * * * *